(12) United States Patent
Kondo

(10) Patent No.: US 6,597,002 B1
(45) Date of Patent: Jul. 22, 2003

(54) SCANNING EXPOSURE APPARATUS AND ITS MAKING METHOD, AND DEVICE MANUFACTURING METHOD

(75) Inventor: Makoto Kondo, Kumagaya (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/722,572

(22) Filed: Nov. 28, 2000

Related U.S. Application Data

(63) Continuation of application No. PCT/JP99/02932, filed on Jun. 2, 1999.

(51) Int. Cl.[7] ............................ A61N 5/00; G01B 27/42; G01B 11/00
(52) U.S. Cl. ...................... 250/492.2; 355/53; 355/55; 355/67; 356/401
(58) Field of Search ............................. 355/53, 67, 55; 250/492.23, 492.2; 356/401

(56) References Cited

U.S. PATENT DOCUMENTS

| | | | | |
|---|---|---|---|---|
| 5,581,324 A | * | 12/1996 | Miyai et al. | 355/53 |
| 5,633,720 A | * | 5/1997 | Takahashi | 356/401 |
| 5,854,671 A | * | 12/1998 | Nishi | 355/53 |
| 6,037,601 A | * | 3/2000 | Okunuki | 250/492.23 |
| 6,172,738 B1 | * | 1/2001 | Korenaga et al. | 355/53 |
| 6,204,912 B1 | * | 3/2001 | Tsuchiya | 355/53 |
| 6,259,511 B1 | * | 7/2001 | Makinouchi et al. | 355/53 |
| 6,268,906 B1 | * | 7/2001 | Suzuki | 355/67 |
| 6,295,119 B1 | * | 9/2001 | Suzuki | 355/53 |
| 6,388,733 B1 | | 5/2002 | Hayashi | |

FOREIGN PATENT DOCUMENTS

| | | |
|---|---|---|
| JP | 8-288198 | 11/1996 |
| JP | 10-97989 | 4/1998 |
| JP | 10-106940 | 4/1998 |
| JP | 10-284371 | 10/1998 |

* cited by examiner

Primary Examiner—John R. Lee
Assistant Examiner—Johnnie L Smith, II
(74) Attorney, Agent, or Firm—Oblon, Spivak, McClelland, Maier & Neustadt, P.C.

(57) ABSTRACT

A device for driving movable blades that set an illumination area on a reticle is composed of linear motors. Therefore, the vibration due to eccentricity will not occur as opposed to the conventional rotary motor. This eliminates one of the major causes of vibration of the device, resulting in improved accuracy on exposure. Since the linear motors drive the blades in the direction corresponding to the synchronous movement of the reticle and the wafer, the linear motors do not cause vibration when the blades move at a constant speed. Therefore, even if the thrust of the linear motors is increased with requirements of a higher reticle stage performance, vibration is not generated during synchronous movement of the reticle and the wafer, thereby improving the synchronous speed, and as a result the throughput.

8 Claims, 8 Drawing Sheets

SCANNING EXPOSURE APPARATUS AND ITS MAKING METHOD, AND DEVICE MANUFACTURING METHOD

CROSS-REFERENCE TO RELATED APPLICATIONS

This is a continuation of International Application PCT/JP99/02932, with an international filing date of Jun. 2, 1999, the entire content of which being hereby incorporated herein by reference.

BACKGROUND OF THE INVENTION

1. Field of the Invention

The present invention relates to a scanning exposure apparatus and its making method, and a device manufacturing method. More particularly, the present invention relates to a scanning exposure apparatus used to manufacture semiconductor devices and liquid crystal display devices and the like in a lithographic process and the method of making the apparatus, and a device manufacturing method using the scanning exposure apparatus to manufacture microdevices such as semiconductor devices.

2. Description of the Related Art

In recent years, in the lithographic process to manufacture devices such as semiconductors, scanning exposure apparatus based on the so-called method such as a slit-and-scan method, and a step-and-scan method have been used with these exposure apparatus, a rectangular or an arcuated illumination area on the mask or a reticle where a pattern is formed (hereinafter generally referred to as a "reticle") is illuminated by an illumination light. The reticle and a substrate such as a wafer are synchronously moved in a one-dimensional direction, and the pattern is sequentially transferred onto the substrate.

With such an apparatus, in order to prevent the areas other than the pattern area on the reticle from being exposed during exposure, a shielding unit (also referred to as a movable reticle blind) is used (see Japanese Patent Laid-Open 04-196513 and the corresponding U.S. Pat. No. 5,473,410 for reference) to drive a movable blade restricting the illumination area on the reticle synchronously with the reticle with the conventional shielding unit, the movable blade is driven in the direction of synchronous movement by the rotational movement of a rotary motor serving as a driving source being converted into a linear motion with a feed screw or a ball screw.

In the manufacturing process of semiconductor devices, it is required to accurately overlay and transfer the pattern formed on the reticle onto the wafer.

With the conventional shielding unit, however, the rotary motor used as the driving source of the movable blade continues to rotate at a constant speed when the movable blade and the reticle are driven synchronously at a constant speed during scanning exposure. This rotation caused vibration to occur due to the rotational inertia eccentric amount, and the vibration affected other members, which in turn reduced the exposure accuracy of the scanning exposure apparatus. In addition, when the number of rotation increased, the vibration component caused by the rotation also increased. This, therefore, was a barrier to high speed of the reticle stage, in other words, a barrier to high scanning exposure performance, which led to a difficulty in improving the throughput.

To keep the vibration caused when driving the shielding unit from affecting other parts of the apparatus, a structure may be considered to physically separate the reticle blind portion including the shielding unit (movable reticle blind), the reticle stage, the wafer stage, and the main column portion (hereinafter referred to as "body" appropriately) incorporating components such as the projection optical system so that the vibration does not spread to the respective parts. The reticle blind, however, does not function as originally planned by simply decoupling the reticle blind and the main column portion.

That is, the fixed reticle blind (fixed field stop) determines the illumination area on the reticle. If, therefore, the vibration affects the fixed reticle blind independently from the body, the illumination area changes on the reticle pattern surface, and this means that the image plane illuminance loses stability during exposure. Also, for the shielding unit or the movable reticle blind to fully exercise its shielding properties, the image of the movable blade which is arranged near the surface conjugate to the reticle pattern surface has to be within the range of the shielding area of the reticle with the current scanning exposure apparatus, therefore, the vibration isolation unit (active vibration isolation unit) which isolates the main column from the vibration is required to maintain the position and posture of the main column at the initial state at all times. This is possible by controlling the vibration so that the affects of the reaction force that occurs when driving the reticle stage or wafer stage will be cancelled out almost simultaneously.

In the case, however, a damped harmonical deformation occurs to the body by the reaction force, even if the vibration isolation unit tries to control the vibration of the body to maintain the position and posture of the body at the initial state, since the body has an extremely high mass and the responsiveness of the driving portion of the vibration isolation unit (actuator) is not that high, it would be difficult to suppress the initial displacement of the body even if a counter-force was applied to cancel the vibration by monitoring the vibration, displacement, and the like.

With the scanning exposure apparatus, higher stage acceleration will be required in future, therefore, in the future scanning exposure apparatus, the tendency of creating vibration that has a vibration period faster than the response speed of the actuator is expected to increase. In such a case, as a consequence, the movable blade of the shielding unit and the reticle cannot be synchronized, therefore, the shielding properties cannot be effectively exercised.

SUMMARY OF THE INVENTION

The present invention has been made in consideration of the inconvenience of the prior art, and has as its object to provide a scanning exposure apparatus capable of reducing the influence of the vibration, caused by driving the shielding unit, on other parts of the apparatus, thereby providing a higher exposure accuracy.

According to the first aspect of the present invention, there is provided a first scanning exposure apparatus which synchronously moves a mask and a substrate to transfer a pattern on the mask onto the substrate, the exposure apparatus comprising: an illumination system which illuminates the mask with an illumination light; a driving system which drives the mask and the substrate in synchronous; a movable blade which limits an illumination area on the mask; a linear motor which drives the movable blade; and a separate portion where the linear motor is arranged, the separate portion being independent at least in respect to vibration from a main portion which exposes the substrate with an illumination light via the mask.

According to this exposure apparatus, the driving system drives the mask and substrate in synchronous in a state where the mask is illuminated by the illumination light of the illumination system. By doing so, the pattern formed on the mask is sequentially transferred onto the substrate. During this scanning exposure, in order to prevent unnecessary portions (portions on the mask other than the pattern area) from being irradiated by the illumination light, the movable blades limiting the illumination area on the mask are driven synchronously with the mask by linear motors. Therefore, problems such as vibration due to rotational inertia eccentric amount which occur when using rotary motors as in the conventional art do not occur. Also, the linear motor is arranged in a separate portion, being separate from a main portion that exposes the substrate with an illumination light via the mask and independent at least in respect to vibration. Therefore, the vibration of the linear motor is not the direct cause of vibration occurring on the main portion side. Accordingly, this removes a major factor of vibration during scanning exposure, and as a consequence, can improve the exposure precision.

With the first scanning exposure apparatus according to the present invention, the exposure apparatus can further comprise a projection optical system which is arranged in the main portion and projects the illumination light onto the substrate.

With the first scanning exposure apparatus according to the present invention, a portion of the illumination system can be arranged in the main portion, and the portion may have a fixed field stop that sets the illumination area. In such a case, the main portion that performs exposure on the substrate has a fixed field stop setting the illumination area on the pattern surface of the mask. Therefore, the fixed field stop and the main portion makes the same motion against vibration, so the illumination area of the illumination light on the substrate (the illumination area on the pattern surface of the mask) does not change. Thus, exposure on unnecessary areas (positional error generated between the illumination area and the mask) on the substrate can be avoided, and the image plane (substrate surface) illuminance stabilizes during S exposure. Also, since only the portion of the illumination system is arranged in the main portion, the total mass of the main portion side can be reduced, as well as lower the center of gravity.

In this case, the illumination system may have an optical integrator arranged in the separate portion.

With the first scanning exposure apparatus according to the present invention, the linear motors may of course be driven in a direction perpendicular to the synchronous moving direction. However, it is preferable for the linear motor to drive the movable blade in a direction corresponding to a first direction in which the mask and the substrate is synchronously moved. This is because, with linear motors, when the movable blades have entered a constantly moving state, thrust is hardly required, therefore, the linear motors are hardly the source of vibration during this state. Accordingly, in addition to improving the exposure accuracy, when a higher performance is required with the synchronous movement velocity, even if the thrust of the linear motors is increased, vibration is hardly generated during the synchronous movement. The synchronous movement velocity, therefore can be increased, which in turn leads to an improvement in throughput.

In this case, the exposure apparatus may further comprise an actuator, which drives the movable blade in a direction corresponding to a second direction and has a static holding force, the second direction being perpendicular to the first direction. In such a case, when the movable blade in respect to the second direction is static, the servo of the actuator can be cut off; therefore, hunting (vibration) is not generated.

In this case, the actuator can be arranged in the separate portion.

According to the second aspect of the present invention, there is provided a second scanning exposure apparatus which synchronously moves a mask and a substrate to transfer a pattern on the mask onto the substrate, the exposure apparatus comprising: a main portion which exposes the substrate with an illumination light via the mask; a first column where the main portion is arranged; a movable shielding member which limits an illumination area of the illumination light on the substrate in accordance with synchronous movement of the mask and the substrate; and a second column which is independent from the first column in respect to vibration, the movable shielding member being arranged in the second column.

With this exposure apparatus, the movable shielding member which is a major source of vibration during scanning exposure, is supported by the second column which is independent in respect to vibration from the first column where the main portion is arranged. Therefore, the vibration of the movable shielding member is not the direct vibration factor of the first column side. Also, the movable shielding member limits the illumination area of the illumination light on the substrate, therefore, usually only need to prevent the irradiation of illumination light for exposure on the area outside the shield strip arranged in the periphery of the pattern area on the mask. The width of the shield strip is normally 1.5–3 mm, or even wider. The accuracy required, therefore, is substantially moderate, even when considering the vibration of the main portion caused by driving the mask, the vibration of the second column caused by driving the movable shielding member, the defocus of the movable shielding member, and the distortion of the optical system. Accordingly, when the pattern formed on the mask is transferred onto the substrate with the mask moved in synchronous with the substrate based on the scanning exposure method, the movable shielding member ensures that the area outside the shield strip in the periphery of the pattern area on the mask is kept from being irradiated by the illumination light. This eliminates a major cause of vibration on the main portion side during scanning exposure, and as a consequence, the exposure accuracy can be improved.

With the second scanning exposure apparatus according to the present invention, the main portion may have a fixed field stop which sets the illumination area of the illumination light on the substrate. In such a case, since the main portion performing exposure has a fixed field stop which sets the illumination area of the illumination light on the substrate (the illumination area on the pattern surface of the mask) the fixed field stop and the main portion moves in the same way. So, the illumination area on the substrate with the illumination light (the illumination area on the pattern surface of the mask) does not change, therefore, exposure of unnecessary areas on the wafer (occurrence of a positional error between the illumination area and the mask) can be avoided, thus stabilizing the image plane (substrate surface) illuminance during exposure.

With the second scanning exposure apparatus according to the present invention, the exposure apparatus may further comprise: an illumination optical system which irradiates the illumination light onto the mask; wherein a portion of the illumination optical system is arranged in the main portion, and the fixed field stop may be arranged within the portion of the illumination optical system. In such a case, only a portion of the illumination optical system is arranged in the main portion, therefore, the total mass of the main portion can be reduced, as well as lower the center of gravity.

In this case, the fixed field stop may be arranged a predetermined distance apart from a surface conjugate with a pattern surface of the mask.

With the second scanning exposure apparatus according to the present invention, in the case a portion of the illumination optical system that includes the fixed field stop is attached to the main portion, the movable shielding member may be arranged within the illumination optical system and a portion of the illumination optical system may be located further on a side of the mask than the shielding member, the portion of the illumination optical system arranged in the main portion. In such a case, since there are almost no moving portions further on the mask side from the movable shielding portion that can be the source of vibration, factors of vibration are substantially eliminated, so the accuracy of moving the mask and the substrate in synchronous can be improved.

In this case, the movable shielding member may be arranged on a surface almost conjugate with a pattern surface of the mask.

With the second scanning exposure apparatus according to the present invention, when a portion of the illumination optical system arranged further on the mask side than the movable shielding member, is arranged in the main portion, the illumination optical system excluding the portion arranged in the main portion may be arranged in the second column. That is, the illumination optical system may be separated into the first partial optical system supported by the second column and the second partial optical system supported by the first column. In this case, the portion of the illumination optical system arranged in the first column and a remaining portion of the illumination optical system arranged in the second column may be respectively arranged in different housings. Housings, here, include frames, which house the partial illumination optical system and barrels (tightly sealed).

With the second scanning exposure apparatus according to the present invention, when a portion of the illumination optical system arranged further on the mask side than the movable shielding member, is arranged in the main portion, the main portion may have a mask stage which moves the mask in respect to the illumination light. In such a case, the motion of the mask stage against vibration can be made the same as that of the main portion, accordingly, as that of the fixed field stop against vibration arranged in the main portion.

In this case, the main portion may have a projection optical system, which projects the illumination light onto the substrate. In such a case, divergence of the optical axis of the portion of the illumination optical system arranged in the main portion and the optical axis of the projection optical system can be avoided.

With the second scanning exposure apparatus according to the present invention, in the case the exposure apparatus further comprises an illumination optical system which irradiates the illumination light onto the mask, the movable shielding member may be arranged within the illumination optical system and a portion of the illumination optical system may be located further on a side of the mask than the shielding member, the portion of the illumination optical system arranged in the main portion. In such a case, since there are almost no moving portions further on the mask side from the movable shielding portion that can be the source of vibration, factors of vibration are substantially eliminated, so the accuracy of moving the mask and the substrate in synchronous can be improved.

With the second scanning exposure apparatus according to the present invention, the exposure apparatus can further comprise an adjustment unit which adjusts a positional relationship between the movable shielding member and the main portion so as keep a positional error between the movable shielding member and the main portion within a permissible value. In such a case, when the mask and the substrate are moved in synchronous, the adjustment unit adjusts the positional relationship between the movable shielding member and the main portion so that the positional error between the movable shielding member and the main portion is kept within a permissible value. Therefore, the movable shielding member can follow-up the mask sufficiently, and does not lose its shielding properties.

In this case, when the exposure apparatus further comprises a driving unit which drives the movable shielding member during scanning exposure of the substrate with the illumination light, the adjustment unit may have a detection unit which detects information related to relative displacement between the movable shielding member and the main, portion, and may control the driving unit in accordance with the information detected by the detection unit. In such a case, the adjustment unit uses the detection unit to detect information related to relative displacement (for example, relative displacement of the initial displacement of the main portion or the displacement between the movable shielding member and the main portion during exposure) between the movable shielding member and the main portion. And according to this information, the adjustment unit controls the driving unit that drives the movable shielding member, during the scanning exposure on the substrate by the illumination light. Therefore, even in the case as described in the prior art where the responsiveness of the actuator of the vibration isolation unit in the main portion (the first column), the driving unit of the movable shielding member which driving portion mass is small and secures high responsiveness can correct the relative displacement (that is the relative error) described above. Thus, the movable shielding member can follow-up the mask sufficiently, and does not lose its shielding properties. In this case, the driving unit may use a conventional rotary motor; however, it is preferable for the driving unit to be a linear motor. This is because linear motors generate less vibration compared to rotary motors, and are capable of high-powered driving, as well as excel in controllability. As a consequence, the position controllability of the movable shielding member itself improves.

With the second scanning exposure apparatus according to the present invention, the exposure apparatus can further comprise: a measurement unit which measures a relative displacement between the first column and the second column; and an adjustment unit which adjusts a positional relationship between the movable shielding member and the main portion in accordance with the relative displacement measured by the measurement unit. In such a case, when the mask and the substrate are synchronously moved, the measurement unit measures the relative displacement between the first column and the second column. And in accordance with the relative displacement measured, the adjustment unit adjusts the positional relationship between the movable shielding member and the main portion. Therefore, the movableshieldingmembercanfollow-upthemasksufficiently, and does not lose its shielding properties.

In this case, when the exposure apparatus further comprises a driving unit which drives the movable shielding member during scanning exposure of the substrate with the illumination light, the adjustment unit can control the driving unit based on a detection result of the measurement unit. In such a case, the measurement unit can measure the initial displacement of the first column or the relative displacement between the first column and the second column during exposure, and in accordance with the measurement results, the adjustment unit drives the driving unit. Therefore, even in the case where the responsiveness of the actuator is low as in the prior art, the relative displacement described above (that is, the relative error) can be corrected with the driving unit of the movable shielding member having a low mass and capable of securing high responsiveness. Thus, the movableshieldingmembercanfollow-upthemasksufficiently, and does not lose its shielding properties.

With the second scanning exposure apparatus according to the present invention, in the case the exposure apparatus comprises the measurement unit, if the measurement unit is capable of measuring an absolute amount of relative displacement between the first column and the second column, the exposure apparatus can further comprise: a decision making unit which decides whether the relative displacement between the first column and the second column in a static state is within a permissible value based on a measurement value of the measurement unit; and a correction unit which corrects a positional error caused by the relative displacement by providing a zero offset corresponding to the relative displacement to the adjustment unit or a position control system of the first column, when a result of the decision making unit is affirmative.

For example, in the case distortion occurs over the elapse of time on the floor where the first column and the second column are respectively set and a static relative displacement occurs between the first column and the second column, when considering a coordinate system with the first column, the optical axes of the respective optical members on the first column side and the optical axes of the respective optical members on the second column side deviates by the distortion of the floor supporting the second column. When this occurs, the origin of the first column side and the origin that the driving unit of the movable shielding member recognizes does not coincide. In this case, if the adjustment unit continues to control the driving unit based on the measurement results of the measurement unit as described earlier without recognizing the shift, the error of the static relative displacement is consequently included in the measurement result itself. Therefore, a synchronous error (positional error) occurs between the movable shielding unit and the mask. To cope with such situation, with the present invention, the decision making unit decides whether the static relative displacement between the first column and the second column in a static state is within a permissible value. And when the decision is affirmative, the correction unit corrects the positional error caused by the relative displacement by providing a zero offset corresponding to the relative displacement to the adjustment unit or the position control system of the first column. Therefore, even when a static relative displacement occurs between the first column and the second column over the elapse of time, the shielding properties are not affected and are kept from losing its properties.

In this case, the "permissible value" described above is the threshold value determined within the range where the zero offset can cope with. Accordingly, when the correction cannot be coped with the zero offset, it is preferable for the exposure apparatus to further comprise a warning unit, which arises a warning, when the result of the decision making unit is negative. By doing so, the operation can acknowledge that a relative displacement exceeding the limit has occurred between the first column and the second column, and can take appropriate action by this warning. Thus, failure in exposure can be avoided in advance. The warning unit may be of a type showing the abnormal state on the display unit by literal information, or a type arising a warning by sound (speech), or by a warning lamp.

According to the third aspect of the present invention, there is provided a third scanning exposure apparatus which synchronously moves a mask and a substrate to transfer a pattern on the mask onto the substrate, the exposure apparatus comprising; a main portion which exposes the substrate with an illumination light via the mask; a movable blade which limits an illumination area on the mask; and an actuator which drives the movable blade in a synchronous movement direction of the mask and the substrate, the actuator being independent at least in respect to vibration from the main portion.

With this exposure apparatus, the actuator driving the movable blade which is the major cause of vibration during scanning exposure in the synchronous movement direction of the mask and the substrate, is arranged separately in respect to vibration from the main portion. Therefore, the vibration of the movable blade and the actuator is not the cause of vibration in the main portion. Also, the movable blade limits the illumination area on the mask, therefore usually only needs to prevent the irradiation of illumination light for exposure on the area outside the shield strip arranged in the periphery of the pattern area on the mask. The width of the shield strip is normally 1.5–3 mm, or even wider. The accuracy required, therefore, is substantially moderate, even when considering the vibration of the main portion caused by driving the mask the defocus of the movable shielding member, and the distortion of the optical system. Accordingly, when the pattern formed on the mask is transferred onto the substrate with the mask moved in synchronous with the substrate based on the scanning exposure method in a state where the mask is illuminated by the illumination light, the movable shielding member can substantially ensure that the area outside the shield strip in the periphery of the pattern area on the mask is kept from being irradiated by the illumination light. This eliminates a major cause of vibration on the main portion side during scanning exposure, and as a consequence, the exposure accuracy can be improved.

According to the fourth aspect of the present invention, there is provided a fourth scanning exposure apparatus which synchronously moves a mask and a substrate to transfer a pattern on the mask onto the substrate, the exposure apparatus comprising; an illumination system which illuminates the mask with an illumination light; a movable blade which sets an illumination area on the mask; and an actuator which drives the movable blade in a direction corresponding to a direction perpendicular to a first direction and has a static holding force, the first direction being a synchronous moving direction of the mask and the substrate and the direction perpendicular to the first direction being a second direction.

With this apparatus, the mask and the substrate is moved in synchronous in a state where the illumination system illuminates the mask with the illumination light, and the pattern formed on the mask is sequentially transferred onto the substrate by a scanning exposure method. During this scanning exposure, in order to prevent unnecessary portions (portions other than the pattern area on the mask) from being irradiated by the illumination light, the movable blade is arranged to set the illumination area on the mask. With the movable blade, in respect to the second direction perpendicular to the first direction in which the mask and substrate are moved in synchronous, the blade need only to be driven prior to scanning exposure to set the size of the illumination area. That is, the blade does not have to be driven during scanning exposure. In this case, an actuator having static holding force is used to drive the movable blade in the second direction, therefore, when the movable blade is stopped in respect to the second direction during scanning exposure, the servo of the actuator can be turned off. Thus, hunting (vibration) is not generated.

In this case, the exposure apparatus may further comprise an actuator which drives the movable blade in the first direction, the actuator being independent at least in respect to vibration from a main portion which exposes the substrate with an illumination light via the mask.

According to the fifth aspect of the present invention, there is provided a first method of making an exposure apparatus which is a scanning exposure apparatus synchronously moving a mask and a substrate to transfer a pattern on the mask onto the substrate, the method of making an exposure apparatus comprising; providing an illumination system which illuminates the mask with an illumination light; providing a driving system which drives the mask and the substrate in synchronous; providing a movable blade which limits an illumination area on the mask; providing a linear motor which drives the movable blade; and providing a separate portion where the linear motor is arranged, the separate portion being independent at least in respect to vibration from a main portion which exposes the substrate with an illumination light via the mask.

With this method, by mechanically, optically, and electrically combining the illumination system, the driving system including the mask stage and the substrate stage, the movable blades and the linear motors, the separate portion where the linear motors are arranged, and other various components the first scanning exposure apparatus in the present invention can be made. In this case, this method can further include the step of providing a projection optical system which projects the pattern image of the mask onto the substrate. In such a case, a projection exposure apparatus based on the method such as a slit scan or a step and scan method can be made.

According to the sixth aspect of the present invention, there is provided a second method of making an exposure apparatus which is a scanning exposure apparatus synchronously moving a mask and a substrate to transfer a pattern on the mask onto the substrate, the method of making an exposure apparatus comprising steps of: providing a main portion which exposes the substrate with an illumination light via the mask; providing a first column where the main portion is arranged; providing a movable shielding member which limits an illumination area of the illumination light on the substrate in accordance with synchronous movement of the mask and the substrate; and providing a second column which is independent from the first column in respect to vibration, the movable shielding member being arranged in the second column.

With this method, by mechanically, optically, and electrically assembling the main portion, the first column, the movable shielding member and the second column, and other various components the second scanning exposure apparatus in the present invention can be made. In this case, this method can further include the step of providing a projection optical system which projects the pattern image of the mask onto the substrate. In such a case, a projection exposure apparatus based on the method such as a slit scan or a step and scan method can be made.

With the method of making the second exposure apparatus, the method of making an exposure apparatus can further comprise a step of providing a fixed field stop which sets the illumination area of the illumination light on the substrate to be incorporated into the main portion. In such a case, an excellent exposure apparatus that avoids exposure on unnecessary areas on the substrate (generate the positional error of the illumination area and the mask), and stabilizes the image plane (surface of substrate) illuminance can be made.

With the method of making the second exposure apparatus, the method of making an exposure apparatus can further comprise the steps of: providing an illumination optical system which irradiates the illumination light onto the mask; and providing the movable shielding member to be arranged within the illumination optical system and a portion of the illumination optical system to be located further on a side of the mask than the shielding member, the portion of the illumination optical system to be arranged in the main portion. In such a case, a scanning exposure apparatus with the total mass of the main portion side reduced, the stability improved and the vibration reduced by lowering the center of gravity can be made.

Furthermore, by performing exposure using the scanning exposure apparatus in the present invention in a lithographic process, a multiple layer of patterns can be formed with high overlay accuracy on a substrate, therefore, microdevices with high integration can be produced with high yield, thus improving the productivity. Therefore, from another aspect of the present invention, there is provided a device manufacturing method that uses the exposure apparatus of the present invention.

DESCRIPTION OF THE PREFERRED EMBODIMENTS

First Embodiment

Figure 1:
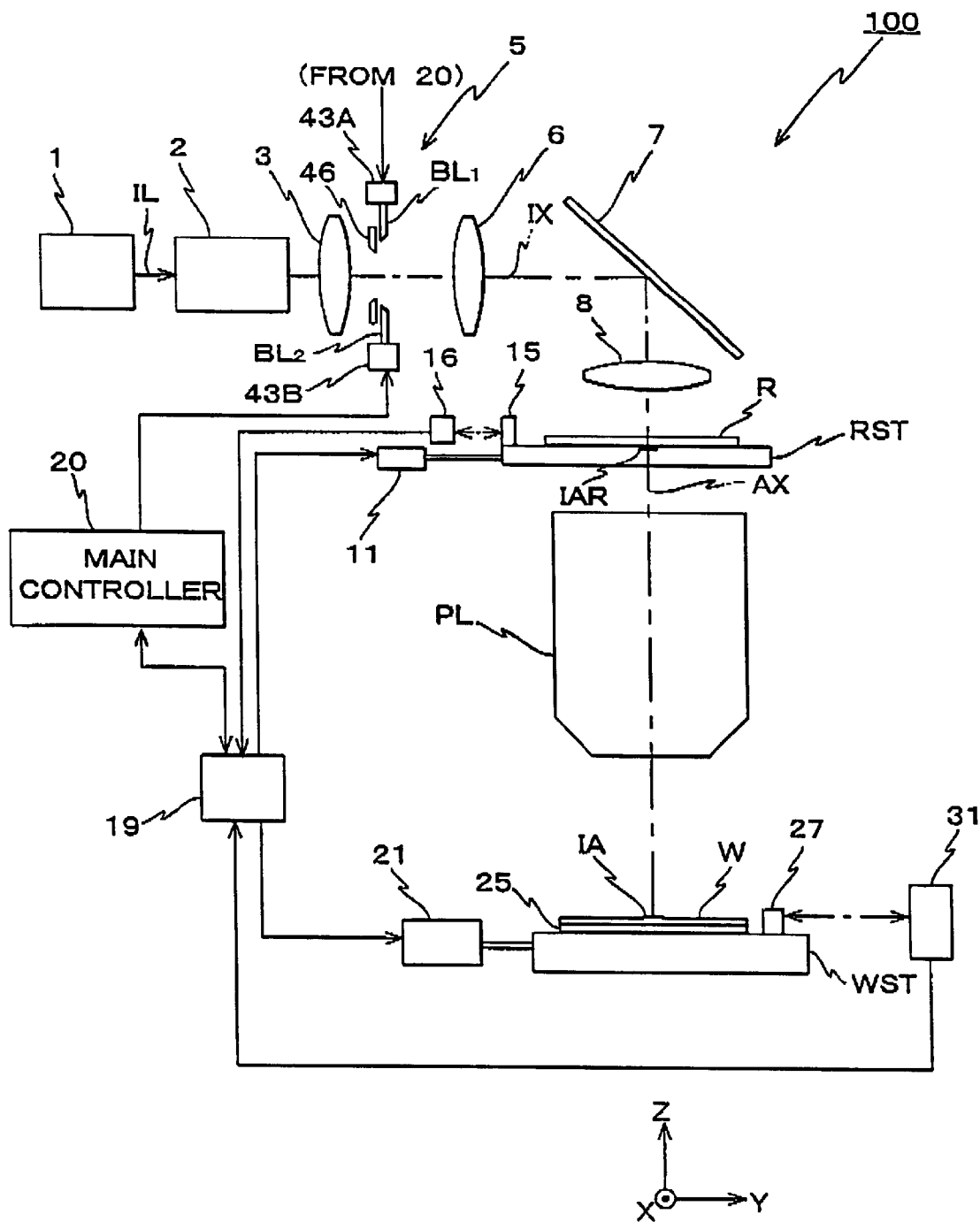
FIG. 1 is a schematic view showing the configuration of the scanning exposure apparatus of the first embodiment in the present invention.

The first embodiment of the present invention will be described below with reference to FIGS. 1 to 3. FIG. 1 shows the schematic arrangement of a scanning exposure apparatus 100 according to the first embodiment. The scanning exposure apparatus 100 is a projection exposure apparatus, based on a so-called step-and-scan method.

The exposure apparatus 100 comprises; an illumination system including a light source 1 and an illumination optical system (2, 3, 5–8); a reticle stage RST to hold a reticle R as a mask; a projection optical system PL; a wafer stage WST as a substrate stage that moves in an XY two-dimensional direction; and a control system for these components, and the like.

The arrangement of the illumination system includes: an illumination unifying optical system 2 made up of the light source 1; a collimator lens; a fly-eye lens and the like (not shown in Figs.) as an optical integrator (a homogenizer); a relay lens 3; a reticle blind 5; a relay lens 6; a deflection mirror 7; and a condenser lens 8, and the like.

The function of the respective portion of the illumination system that has the arrangement above will be briefly described next. The illumination light (exposure light) IL emitted from the light source 1 passes through a shutter (not shown in Figs.), and then is converted into a light flux that has an almost uniform illuminance distribution. As the illuminating light IL, an emission line (g line or i line) in the ultraviolet light region emitted from an ultra-high pressure mercury lamp, an excimer laser beam (a KrF excimer laser beam or an ArF excimer laser beam), an $F_2$ laser beam, an $Ar_2$ laser beam, or a metal vapor laser beam or a harmonic of a YAG laser beam, and the like, may be used.

Th light flux, outgoing from the illumination unifying optical system 2 reaches the reticle blind 5 via the relay lens 3. The reticle blind 5 is configured of, for example, a movable blind unit (which will be described later) having two movable blades $BL_1$ and $BL_2$, and a fixed blind 46 that has its opening shape fixed and is arranged near the movable blind unit. The arrangement surface of the movable blades $BL_1$ and $BL_2$ that make up the movable blind unit is conjugate to the pattern surface of the reticle R. The fixed blind 46 is arranged apart by a predetermined distance from the conjugate surface of the pattern surface in the direction along the optical axis IX (Y direction), and is a field stop which is a rectangular shaped opening formed by, for example, four knife. edges. The movable blades $BL_1$ and $BL_2$ determine the width of the rectangular opening in the z direction (the portrait direction) and the x direction (the landscape direction). By using the fixed blind 46 and movable blades $BL_1$ and $BL_2$, the slit-shaped illumination area IAR (see FIG. 2) through which the reticle R is illuminated, can be set at a rectangular shape of a preferred size and form.

The light flux having passed through the reticle blind 5 then passes through the relay lens 6 and reaches the deflection mirror 7. It is then vertically bent downward, and illuminates the illumination area IAR portion of the reticle R, on which a circuit pattern or the like is drawn.

Figure 2:
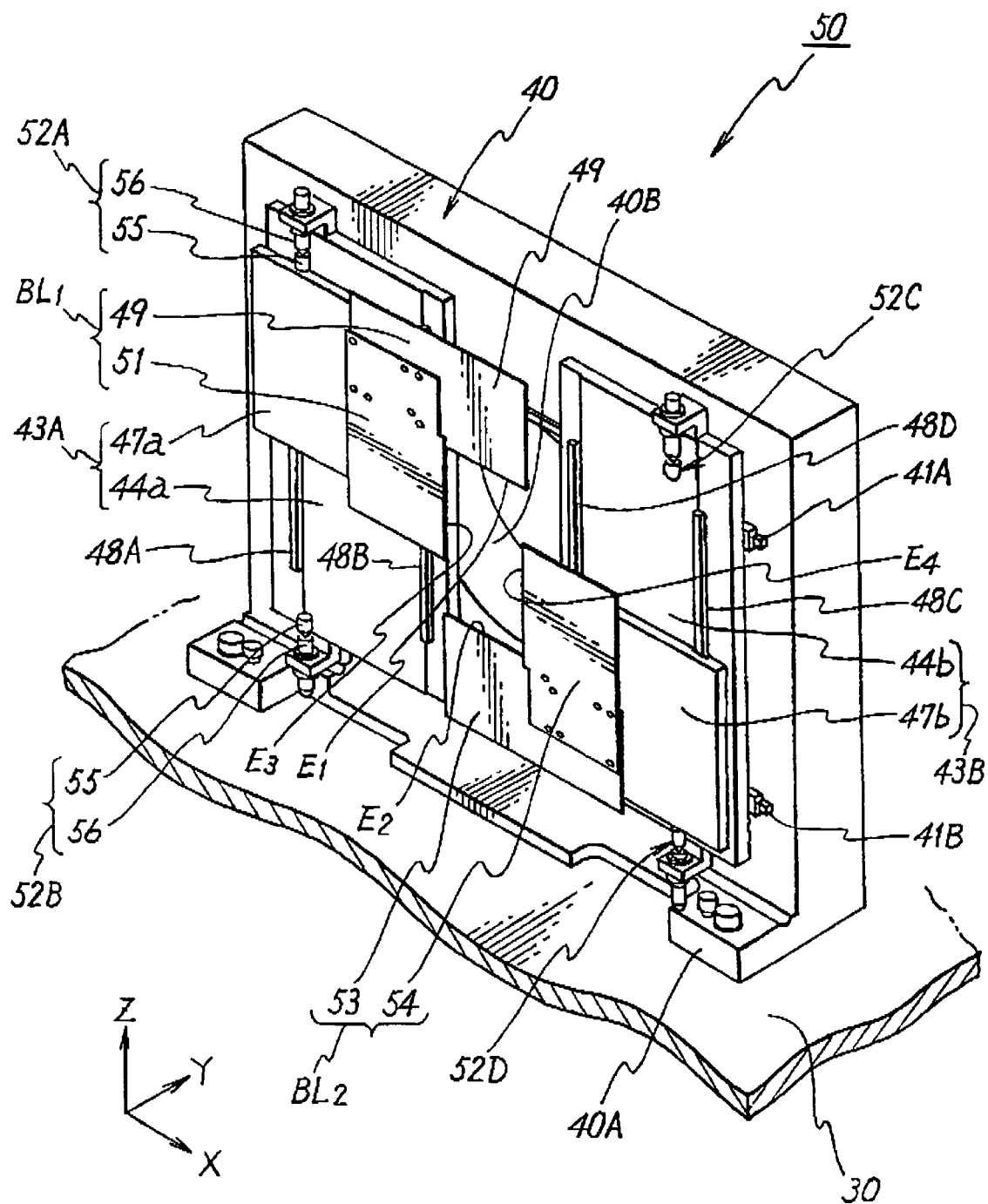
FIG. 2 is a schematic view exemplifying a concrete arrangement of the movable reticle blind shown in FIG. 1.

Although it is not illustrated in FIG. 1, the respective portions structuring the illumination optical system (2, 3, 5–8) are fixed inside a case called an illumination casting (refer to the reference number 30 in FIG. 2). This case is supported by a support frame planted on the mainframe (neither of them shown in Figs.).

On the reticle stage RST, the reticle R is fixed, for example, by vacuum chucking. The reticle stager RST is structured, so that it can be finely driven two-dimensionally (in the X-axis direction, the Y-axis direction being perpendicular to the X-axis direction, and in the rotational direction around the Z axis being perpendicular to the XY plane) within a plane perpendicular to the optical axis IX (coincides with the optical axis AX of the projection optical system PL) of the illumination optical system to perform positioning of the reticle R.

The reticle stage RST also can be driven at a predetermined scanning velocity in the predetermined direction (in this case the Y-axis direction) on the reticle base by the reticle driving portion 11 made up of linear motors and the like. The position and the rotational amount of the reticle stage RST within the moving surface is detected at all times with the reticle laser interferometer 16 via the movable mirror 15, at for example, a resolution of around 0.5–1 nm. The movable mirror 15 is fixed on the upper surface of the reticle stage RST. The positional information of the reticle stage RST from the interferometer 16 is sent to the main controller 20 via the stage control system 19. And the stage control system 19, corresponding to the instructions from the main controller 20 controls the reticle stage RST via the reticle driving portion 11 based on the positional information of the reticle stager RST. A holding member made of Invar, which holds the projection optical system FL holds the reticle base, and the holding member is planted on the mainframe.

The projection optical system PL is arranged under the reticle stage RST as shown in FIG. 1, and the direction in the optical axis (coincides with the optical axis IX of the illumination optical system) is the Z-axis direction. The projection optical system PL is, for example, a double telecentric reduction system, that is made up of a plurality of lens elements arranged along the optical axis direction in predetermined intervals. The projection magnification β of the projection optical system PL is such as ¼, ⅕, or ⅙.

The wafer stage WST is driven in the XY two-dimensional direction via a wafer driving portion 21 consisting of, for example, planar motors. On the wafer stage WST, a wafer holder 25 is fixed. The wafer W is held on the wafer stage with the wafer holder 25, for example, by vacuum chucking. The surface of the wafer w is arranged so that it is conjugate with the pattern surface of the reticle R in reference to the projection optical system PL. So when the illumination area IAR of the reticle R is illuminated by the illumination light IL, the illumination light IL having passed through the reticle R forms a reduced image (a partially inverted image) of the circuit patter of the reticle R within the illumination area IAR via the projection optical system PL on the wafer W which is coated with a photoresist.

Also, the position and the rotation amount (yawing amount, pitching amount, and rolling amount) of the wafer stage WST within the XY plane, is detected by the wafer laser interferometer 31 via the movable mirror 27 at, for example around a resolution of 0.5–1 nm. The positional information (or the velocity information) of the wafer stage WST is sent to the main controller 20 via the stage control system 19. And the stage control system 19, corresponding to the instructions from the main controller 20 controls the wafer stage WST via the wafer driving portion 21 based on the positional information (or the velocity information) of the reticle stager RST.

With the scanning exposure apparatus 100 in this embodiment, the reticle R is illuminated through the illumination area IAR that has a rectangular shape (slit shape) with the longitudinal direction in the direction perpendicular (X-axis direction) to the scanning direction of the reticle R (Y-axis direction). And when the reticle R is scanned in the −Y direction (or the +Y direction) at a velocity $V_R$, the wafer W is scanned in synchronous in the opposite direction of the reticle R (velocity $V_R$) at a velocity $V_W$ (=β·$V_R$). By this operation, the entire pattern of the reticle R is accurately transferred onto each shot area of the wafer W. During this scanning exposure, the main controller 20 controls the movable blades $BL_1$ and $BL_2$ as is described later in the description.

The movable blind unit (hereinafter referred to as the "movable blind unit 50") including the movable blades $BL_1$ and $BL_2$ will be described next, referring to FIG. 2. FIG. 2 shows an example of an arrangement of the movable blind unit 50 schematically in a perspective view. As is shown in FIG. 2, the movable blind unit 50 is fixed on the upper surface (the surface on the side of the +Z direction) of the casting 30 of the illumination optical system. It includes a base 40, the movable blades $BL_1$ and $BL_2$, linear motors 43A and 43B that are of a moving magnet type, mechanical limit dampers 52A to 52D, and the like.

The base 40, is made of a rectangular plate shaped material having an overall predetermined thickness with the attachment portion 40A on the lower end (on the end of the −Z direction) extended in the −Y direction, and around the center a circular opening 40B is formed. On one side (the −Y side) of the surface of the base 40, non-scanning axis guides 41A and 41B extending in the X-axis direction are respectively fixed on the opening 40B arranged on both ends of the Z direction.

The respective stators 44a and 44b of the linear motors 43A and 43B are arranged on the non-scanning axis guides 41A and 41B, and can be respectively moved driven by, for example, an ultrasonic motor (not shown in Figs.), in the X direction.

The stator 44a and 44b, that is the non-scanning blade 51 and 54 which will be described later, are usually driven prior to scanning exposure to set the size of the illumination area IAR in correspondence with the width of the pattern area of the reticle R in respect to the non-scanning direction (the X-axis direction). They are not driven during scanning exposure, therefore, as the driving unit for the stator 44a and 44b (non-scanning blade 51 and 54), in this embodiment an actuator having static holding force such as the ultrasonic motor is used. By doing so, when the stator 44a and 44b are static the ultrasonic motor does not generate heat, and in addition since the servo can be turned off advantages such as the hunting (vibration) due to servo not being generated can be gained.

With the stator 44a on one side (the −X side), a pair of scanning axis guides 48A and 48B extending in the Z direction are arranged at a predetermined interval in the X direction. The mover 47a of the linear motor 43A is relatively driven in respect to the stator 44a along the scanning axis guides 48A and 48B. On the mover 47a the movable blade $BL_1$, for example arranged in the shape of an L, is integrally fixed. The movable blade $BL_1$ is structured with the rectangular plate shaped non-scanning blade 51 laid perpendicular on the upper surface of the rectangular plate shaped scanning blade 49, integrated in this overlapping state. The edge $E_1$ of the scanning blade 49 on the −Z direction side extends in the X direction, and this edge $E_1$ determines one end of the illumination area IAR on the reticle R in the scanning direction. And, the edge $E_3$ of the non-scanning blade 51 on the +X direction side extends in the Z direction, and this edge $E_3$ determines one end of the illumination area IAR on the reticle R in the non-scanning direction.

On the upper and lower portion of the stator 44a, mechanical limit dampers 52A and 52B are arranged so as to limit the movement of the mover 47a in the +Z, −Z direction. These mechanical limit dampers 52A and 52B, for example, respectively comprise a stopper 55 which is in contact with the side surface of the mover 47a and physically limits the movement of the mover 47a, and a damper 56 which pressures the stopper 55 in the direction of the mover 47a at all times, and a microswitch (not shown in Figs.) being in a normally closed state by the damper 56. In this case, the microswitch structuring the mechanical limit damper 52A is arranged in a part of a circuit to drive the mover 47a in the +Z direction. In this circuit, when the mover 47a comes into contact with the stopper 55, the contact point opens, cutting off the current supply from the power supply circuit to the coil (not shown in Figs.) making up the stator 44a. Similarly, the microswitch structuring the mechanical limit damper 52B is arranged in a part of a circuit to drive the mover 47a in the −Z direction. And when the mover 47a comes into contact with the stopper 55, the contact point opens, cutting off the current supply from the power supply circuit to the coil (not shown in Figs.). In this case, the microswitches structuring the mechanical limit dampers 52A and 52B never open at the same time, therefore, the mover 47a is drivable in either the +Z direction or the −Z direction at all times.

With the stator 44b, on the other side (the +X side), a pair of scanning axis guides 48C and 48D extending in the Z direction are arranged at a predetermined interval in the X direction. The mover 47b of the linear motor 43B is relatively driven in respect to the stator 44b along the scanning axis guides 48C and 48D. On the mover 47a the movable blade $BL_2$, is integrally fixed arranged in the shape of an L. The movable blade $BL_2$, similar to the movable blade $BL_1$, is structured integrally with the scanning blade 53 and the non-scanning blade 54. The edge $E_2$ of the scanning blade 53 on the +Z direction side extends in the X direction, and this edge $E_2$ determines the other end of the illumination area IAR on the reticle R in the scanning direction. And, the edge $E_4$ of the non-scanning blade 54 on the −X direction side extends in the Z direction, and this edge $E_4$ determines the other end of the illumination area IAR on the reticle R in the non-scanning direction.

In the description above, the scanning blade 49 and the non-scanning blade 51 are integrated and form the movable blade $BL_1$, and the scanning blade 53 and the non-scanning blade 54 are integrated and form the movable blade $BL_2$. The scanning blade 49 and the non-scanning blade 51, however, may be made separate, and similarly, the scanning blade 53 and the non-scanning blade 54 can also be made separate. That is, the four blades 49, 51, 53, and 54 may be structured so that they are driven independently. In this case, the four blades may be respectively driven by linear motors, or the scanning blades 49 and 53 may be driven by linear motors while the non-scanning blades may be driven by forces other than linear motors, such as ultrasonic motors.

On the upper and lower portion of the stator 44b, mechanical limit dampers 52C and 52D are arranged so as to limit the movement of the mover 47b in the +Z, −Z direction. These mechanical limit dampers 52C and 52D have identical structures as of the mechanical limit dampers 52A and 52B described earlier, and function similarly.

The main controller 20 controls the driving circuit, which drives the mover 47a and 47b of the linear motor 43A and 43B, and the ultrasonic motors (not shown in Figs.), which drive the linear motors 43A and 43B in the X direction. By this control, the shape (including size) of a rectangular shaped opening (hereinafter referred to as "aperture AP") is determined by the edges $E_1$, $E_2$, $E_3$, and $E_4$ in a preferred rectangular shape. The aperture AP is enlarged and projected on the reticle R by the relay lens 6 and condenser lens 8, thus the illumination area IAR is formed. The projection magnification is set, at for example, 2.5. And, by adjusting the projection magnification of the aperture AP, it is possible to change (finely adjust) the size of the illumination area IAR.

The exposure operations of the scanning exposure apparatus 100 in this embodiment having the arrangement above will be described next, with reference to FIG. 3.

After preparatory operations such as reticle alignment and baseline measurement using the reticle microscope and the off-axis alignment sensor (both not shown in Figs.) have been completed, fine alignment (such as EGA (enhanced global alignment)) of the wafer W using the alignment sensors is performed. Then, the arrangement coordinates of the plurality of shot areas on the wafer W are obtained. The details of preparations for the reticle alignment and baseline measurement, are disclosed in detail in, for example, Japanese Patent Laid Open No. 04-324923, and the corresponding U.S. Pat. No. 5,243,195. Also, as for EGA that follow the preparatory operations, it is disclosed in, e.g., Japanese Patent Laid Open No. 61-44429 and the corresponding U.S. Pat. No. 4,780,617. The disclosures cited above are fully incorporated herein by reference.

Next, the stage controlling system 19 moves the reticle stage RST via the reticle driving portion 11 in accordance with instructions from the main controller 20, and sets the reticle R at the scanning starting position in the Y direction. Likewise, the stage controlling system 19 mover the wafer stage WST via the wafer driving portion 21 in accordance with instructions from the main controller 20, and sets a corresponding shot area on the wafer W at the scanning starting position in the Y direction.

The stage controlling system 19, then synchronously moves the reticle stage RST and the wafer stage WST in opposite directions via the reticle driving portion 11 and the wafer driving portion 21 at a velocity corresponding to the projection magnification, thus performing scanning exposure. On exposure, the respective stages are accelerated after starting scanning until they reach a predetermined target scanning velocity. As soon as they reach the target scanning velocity, exposure is performed, and when exposure is completed, the respective stages move into a decelerated state. During this scanning exposure, the main controller controls the motion of the movable blades $BL_1$ and $BL_2$ so as to keep the glass portion outside the shielding strip that divides the pattern areas of the reticle R from being irradiated by the illumination light IL.

Figure 3:
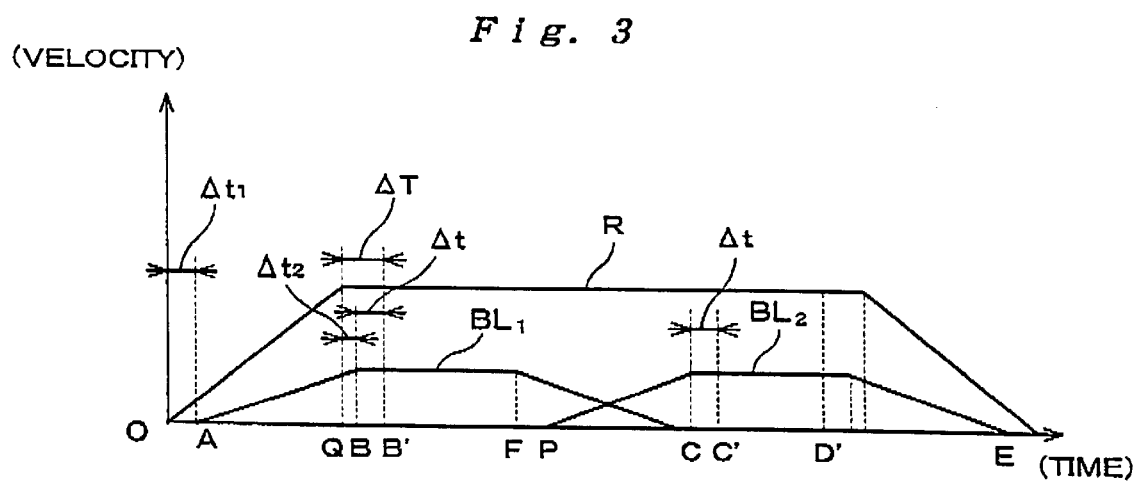
FIG. 3 is a graphical view showing the temporal change of the velocity of the reticle R in the Y direction being synchronously moved, with the temporal change of the velocity of the movable blade in the Y direction.

FIG. 3 shows the temporal change of the velocity in the Y direction of the reticle R being synchronously moved along with the temporal change of the velocity in the Y direction of the movable blades $BL_1$ and $BL_2$. A brief explanation of how the movable blades $BL_1$ and $BL_2$ are controlled during scanning exposure will be next, referring to FIG. 3.

When the time $\Delta t_1$ has elapsed after the reticle stage RST starts accelerating, the main controller 20 begins to accelerate only the movable blade $BL_1$ on the side of the proceeding direction of the reticle R by, for example, controlling the linear motor 43A. With this operation, the acceleration of the movable blade $BL_1$ begins at point A in FIG. 3, for example, at acceleration ⅔ times as of the reticle R. The acceleration is completed at point B, which is a mere fraction $\Delta t_2$ later than the point Q where the reticle R reaches the target scanning velocity and finishes accelerating. And at point B' where the time $\Delta T$ (the synchronous settling time of the reticle R and the wafer W) has elapsed after point Q, the movable blade $BL_1$ also fulfills the synchronous settling time (the settling time $\Delta t$ having elapsed), and reaches a synchronized state moving at a constant speed.

During the period between point A and point B' in FIG. 3, the illumination light IL which illuminates the slit shaped illumination area portion determined by the fixed reticle blind 46 illuminates the area off the reticle R or the shielding strip, or is shielded by the movable blade $BL_1$. Thus, the glass portion outside the shielding strip of the reticle R is kept from being irradiated. Also, at point B', the edge $E_1$ of the movable blade $BL_1$ perfectly matches an edge of the slit shaped illumination area in the scanning direction determined by the fixed blind 46.

From point B', the reticle R and the movable blade $BL_1$ synchronously move at a constant speed, and exposure with the illumination light IL begins on the illumination area IAR where both ends in the scanning direction are determined by the fixed blind 46. The width of the illumination area IAR in the non-scanning area is determined by the edges $E_3$ and $E_4$ of the movable blades $BL_1$ and $BL_2$.

From point B' to point F in FIG. 3, the movable blade $BL_1$ moves at a constant speed in synchronous with the reticle R. Then, after elapse of a predetermined time, at point F in FIG. 3, the movable blade $BL_1$ starts to decelerate. After the movable blade $BL_1$ starts to decelerate and a predetermined time has elapsed, at point P of FIG. 3 the main controller 20 starts the acceleration of the movable blade $BL_2$ via the linear motor 43B. And when a predetermined time elapses and comes to point C in FIG. 3, the movable blade $BL_2$ completes the acceleration. Right after the movable blade $BL_2$ starts to accelerate, the movable blade $BL_1$ completes its deceleration.

The movable blade $BL_2$ completes its acceleration at point C, and after the elapse of the settling time $\Delta t$, enters a state where it moves at a constant speed in synchronous with the reticle R. Then, at point D', exposure, in other words, transferring the reticle pattern onto the wafer is completed. At this point, the edge $E_2$ of the movable blade $BL_2$ coincides with the other end of the illumination area IAR in the scanning direction determined by the fixed blind 46.

After completing exposure, the movable blade $BL_2$ and the reticle R respectively move at a constant speed corresponding to the settling time (overscan), and then the movable blade $BL_2$ and the reticle R respectively start deceleration. Accordingly, for a predetermined period after exposure is completed at point D', the movable blade $BL_2$ shields the illumination light IL irradiating the illumination area portion determined by the fixed blind 46. With this operation, the glass portion outside the shielding strip of the reticle R is kept from being irradiated.

Finally, at point E, the movable blade $BL_2$ stops moving. At this point, the reticle R is off the illumination area determined by the fixed blind 46. Then, after a mere fraction later (almost equivalent to the time $\Delta t_1$), the reticle R also stops.

By these operations, exposure of the reticle R per scan (exposure per one shot) is completed.

Next, the stage control system 19 steps the wafer stage WST by one column of the shot area in response to instructions from the main controller 20, and then scans the wafer stage WST and reticle stage RST in directions opposite as before. Consequently, scanning exposure is performed on a different shot area on the wafer.

As is obvious from the descriptions above, in this embodiment, the reticle driving portion 11, the wafer driving portion 21, and the stage control system 19 make up a driving system.

As is described in detail, with the scanning exposure apparatus 100 in this embodiment, the driving unit driving the movable blades $BL_1$ and $BL_2$ which limit the illumination area IAR on the reticle R in the direction corresponding to the scanning direction, is structured of linear motors 43A and 43B. Therefore, problems such as vibration due to rotational inertia eccentric amount which occur when using rotary motors as in the conventional art do not occur, removing a major factor of vibration during scanning exposure, in turn allowing the exposure precision to improve.

In addition, with linear motors 43A and 43B, when moving the movable blades $BL_1$ and $BL_2$ in a constant state, only a small amount of thrust needs to be generated against the frictional resistance such as air. The linear motors 43A and 43B, therefore, can hardly be the source of vibration during the constant movement of the movable blades $BL_1$ and $BL_2$. Accordingly, even if the movable blades $BL_1$ and $BL_2$ are driven in the synchronous moving direction in synchronous with the reticle R during scanning exposure, the exposure precision does not deteriorate. And, in the case the reticle stage RST and the wafer stage WST are subject to higher acceleration, the thrust of the linear motors can be increased corresponding to the acceleration without generating vibration during synchronous movement. Therefore, the velocity of the reticle stage RST and wafer stage WST while moving in a synchronous state can be improved, which leads to an improvement in throughput.

In the embodiment above, the type of motors used for the linear motors 43A and 43B are moving magnets, however, the present invention is not limited to this, and may use a moving coil type for the driving unit of the movable blades.

Also, in the embodiment above, only the driving unit which drives the movable blades $BL_1$ and $BL_2$ in the direction corresponding to the synchronous moving direction (the scanning direction) is structured of linear motors. However, linear motors may also be used for the driving unit which drives the movable blades $BL_1$ and $BL_2$ in the direction perpendicular to the synchronous moving direction (the non-scanning direction) Furthermore, the driving unit which drives the movable blades $BL_1$ and $BL_2$ in the direction corresponding to the non-scanning direction can be structured of motors other than ultrasonic motors or linear motors, for example, such as DC motors. In addition, the description is omitted in the embodiment above, however, it is preferable to arrange a cooling mechanism in respect to the linear motors driving the movable blades $BL_1$ and $BL_2$, so as to suppress the linear motor from generating heat.

Second Embodiment

Figure 4:
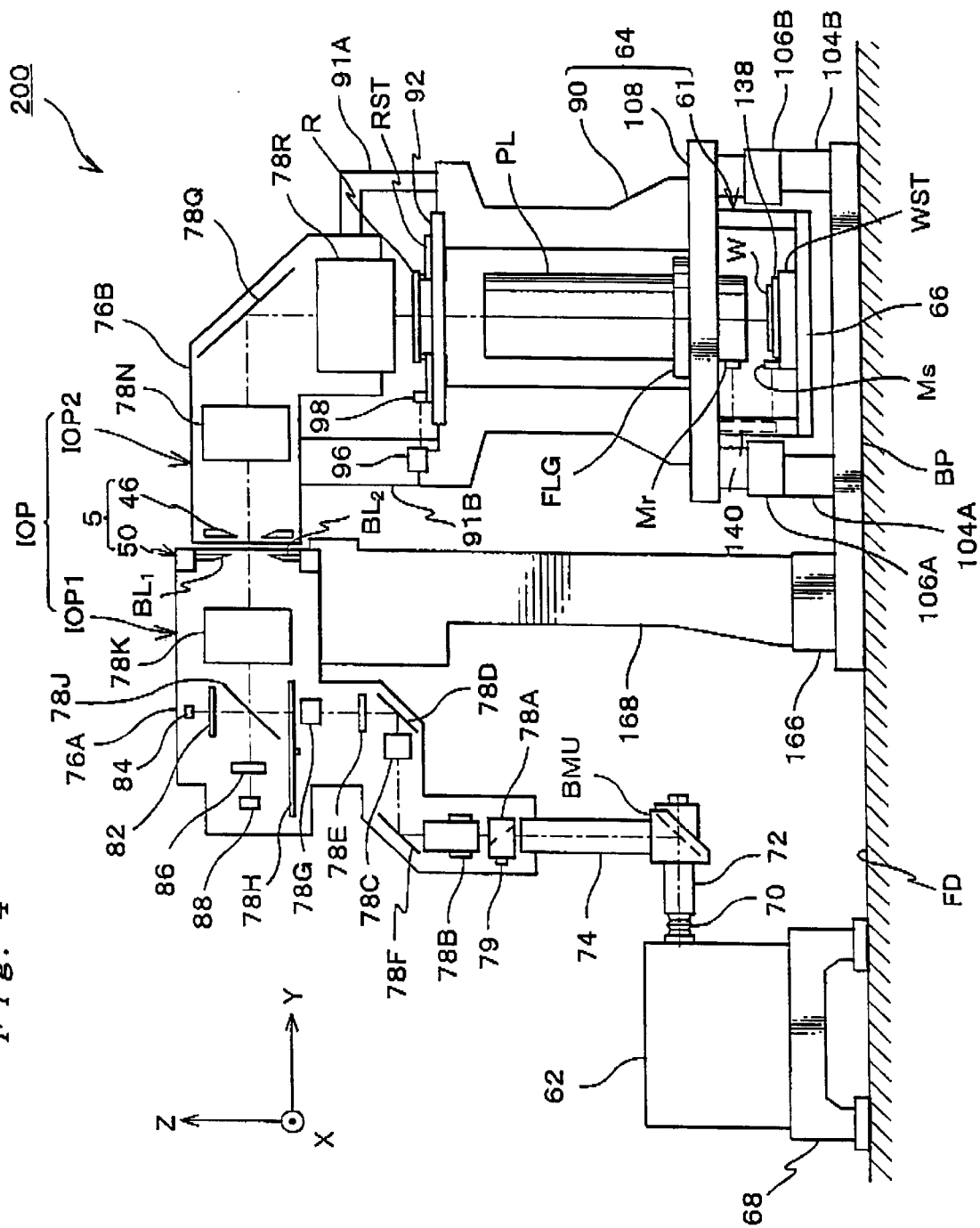
FIG. 4 is a schematic view showing the configuration of the scanning exposure apparatus of the second embodiment in the present invention.

The second embodiment of the present invention will be described below with reference to FIGS. 4 to 6. FIG. 4 shows the schematic arrangement of an exposure apparatus 200 according to the second embodiment. The exposure apparatus 200 transfers the circuit pattern formed on the reticle R as a mask onto the respective shot areas on the wafer W as a substrate via a projection optical system PL, while moving the reticle R and the wafer W in synchronous in a linear direction (in this case the Y-axis direction). That is, the exposure apparatus 200 is a scanning exposure apparatus based on a so-called step-and-scan method, in other words, a so-called scanning stepper.

The exposure apparatus 200 comprises: a light source 62, an illumination optical system IOP which illuminates the reticle R with an illumination light emitted from the light source 62; a reticle stage RST to hold the reticle R as a mask; a projection optical system PL which projects the illumination light outgoing from the reticle R (a pulse ultraviolet light) onto the wafer W; a wafer stage WST as a substrate stage that holds the wafer W; a main column 64 as a first column which supports the reticle stage RST, the projection optical system PL, and water stage WST, and the like; a vibration isolation system which suppresses or removes the vibration caused by the main column 64, and a control system for these components, and the like.

As the light source 62, an ArF excimer laser light source is used which emits an ArF excimer laser beam narrowbanded between the wavelength of 192–194 nm so as to avoid the absorption range by oxygen. The main portion of the light source 62 is arranged on the floor surface FD in the clean room of a semiconductor manufacturing site via a vibration isolation unit 68. Along with the light source 62, a light source control unit 63 (not shown in FIG. 4, refer to FIG. 6) is arranged. This light source control unit 63 controls the oscillation center wavelength and the spectral line width (half-bandwidth) of the pulse ultraviolet beam emitted, the trigger timing of the pulse oscillation, and the gases in the laser chamber, and the like, in accordance with instructions from the main controller 101 (not shown in FIG. 4, refer to FIG. 6) which will be described later.

The light source 62 can be arranged in a separate room (service room) having a lower degree of cleanliness than that of the clean room, or in a utility space provided underneath the floor of the clean room.

The light source 62 is connected to one end (the incident end) of the beam matching unit BMU via a light-shielding bellows 70 and a pipe 72. The other end (the outgoing end) of the beam matching unit BMU is connected to the illumination optical system IOP via a pipe 74.

Within the beam matching unit BMU, a plurality of movable reflecting mirrors (omitted in Figs.) are arranged. The main controller 101 uses these movable reflecting mirrors, to perform positional matching of the optical path of the narrowbanded pulse ultraviolet light (ArF excimer laser beam) emitted from the light source 62 and incident via the bellows 70 and the pipe 72 with the first partial illumination optical system IOP1 described below.

The illumination optical system IOP is made up of the first partial illumination optical system IOP1 and the second partial illumination optical system IOP2. These first and second partial illumination optical system IOP1 and IOP2 respectively comprise a first and second illumination system housing 76A and 76B which interior is sealed from outside air. Inside the illumination system housing 76A and 76B, air (oxygen) concentration does not exceed a few percent, and is preferably filled with clean dry nitrogen gas ($N_2$) or a helium gas (He) having an air (oxygen) concentration less than 1%. The illumination system housing referred to here, includes the frame which houses the partial illumination optical system and an airtight barrel.

Inside the first illumination system housing 76A, a variable beam attenuator 78A, a beam shaping optical system 78B, a first fly-eye lens system 78C, a vibrating mirror 78D, a condenser lens 78E, a mirror 78F, a second fly-eye lens system 78G, an illumination system aperture stop plate 78H, a beam splitter 78J, a first relay lens 78K, and a movable blind unit 50 structuring the reticle blind 5, and the like are housed in a predetermined positional relationship. Also, within the second illumination system housing 76B, a fixed reticle blind 46 serving as a fixed field stop, a second relay lens 78N, a mirror 78Q, and the main condenser lens system 78R, and the like are housed in a predetermined relationship.

Following is a description of the respective units structuring the first and second illumination system housing 76A and 76B. The variable beam attenuator 78A adjusts the average energy per each pulse ultraviolet beam. For example, a plurality of optical filters that have different beam attenuating ratios being arranged so that they can be switched is to change the beam attenuating ratio in sequence can be used. Or the degree of two optical filters overlapping one another which transmittance continuously varies can be adjusted so as to make the beam attenuation ratio continuously variable. The optical filter structuring the variable beam attenuator 78A is driven by the driving mechanism 79 that includes the motor controlled by the illumination control unit 80 (not shown in FIG. 4, refer to FIG. 6), which is under the control of the main controller 101.

The beam shaping optical system 78B shapes the sectional shape of a pulse ultraviolet beam controlled to a predetermined peak intensity by the variable beam attenuator 78A, so that it becomes identical to the general shape of the incident end of the first fly-eye lens system 78C. This improves the incident efficiency of the Pulse ultraviolet beam on the first fly-eye lens 78C. The beam shaping optical system 78B is structured of a cylinder lens or a beam expander (omitted in Figs.) and the like.

The double fly-eye lens system functions to uniform the intensity distribution of the illuminating light. It is configured of the first fly-eye lens system 78C which is sequentially arranged on the optical path of the pulse ultraviolet beam behind the beam forming optical system 78B, the condenser lens system 78E, and the second fly-eye lens system 78G. In this case, between the first fly-eye lens system 78C and the condenser lens system 78E, a vibrating mirror 78D for smoothing interference fringes or tiny speckles caused on the irradiated surface (reticle surface or wafer surface) is arranged. Vibration of the vibrating mirror 78D (deflection angle) is controlled by the illumination control unit 80, which is under the control of the main controller 101 via a driving system not shown in Figs. A similar structure with a combination of a double fly-eye lens system and a vibrating mirror as in this embodiment, is disclosed in detail in Japanese Patent Laid Open No. 01-259533 and in the corresponding U.S. Pat. No. 5,307,207. The disclosures cited above are fully incorporated herein by reference.

An illuminating system aperture stop plate 78H made from a disk-shaped member, is arranged near the emitting surface of the second fly-eye lens system 78G. On this illuminating system aperture stop plate 78H, a plurality of aperture stops are arranged at substantially equal angular intervals. The aperture stops may have an ordinary circular aperture, or it may have a small circular-shaped aperture for reducing the σ-value, which is a coherence factor. It may also have a ring-shaped aperture for ring-shaped illumination, or a plurality of apertures (for example, four apertures) of which each central position differ from the optical axis position for modified illumination.

The beam splitter 78J having a large transmittance and a small reflectance is arranged downstream of the illumination system aperture stop 78H on the optical path of the pulse ultraviolet beam. Further downstream of the optical path, the first relay lens 78K and the movable blind unit 50 are sequentially arranged. The movable blind unit 50 has an identical structure as of the one described in the first embodiment (see FIG. 2), and is similarly arranged in the vicinity of the outgoing end within the first illumination system housing 76A.

The fixed reticle blind 46 used in this embodiment has an identical structure as of the one described in the first embodiment. It is arranged on a surface slightly defocused from the conjugate plane relative to the pattern surface of the reticle R near the incident end of the second illumination system housing 76B. The opening portion of the fixed reticle blind 46 is formed within a circular field view of the projection optical system PL. And with the optical axis of the projection optical system PL as the center, extends linearly in a slit or a rectangular shape in the X-axis direction which is perpendicular to the moving direction of the reticle R (Y-axis direction) during scanning exposure. The reason for arranging the fixed reticle blind 46 slightly defocused from the conjugate plane relative to the pattern surface of the reticle R, is firstly because with a scanning exposure apparatus, especially with an exposure apparatus using a pulse beam as illumination light for exposure, so as to make the illuminance distribution of the pulse beam within the illumination area on the reticle (wafer) relative to the scanning direction into a trapezoid shape (having slopes at the both ends), to unify the exposure amount in each shot area on the wafer W on scanning exposure. Secondly, the edge portion of the reticle blind 46 may be partly chipped, or may not be formed in a straight line, therefore to reduce these adverse effects the edge portion of the illumination area on the pattern area of the reticle R is moderately blurred.

In this case, similar with the first embodiment where the illumination area is further restricted at the beginning and end of scanning exposure by the movable blades $BL_1$ and $BL_2$ making up the movable blind unit 50, exposure on unnecessary portions are avoided. This movable blind unit 50 is controlled by the main controller 101 (refer to FIG. 6).

The reason for arranging the movable blind unit 50 and the fixed reticle blind 46 in different illumination system housings in this embodiment, that is, the reason for separating these components, will be described later.

The second relay lens 78N structuring the relay optical system with the first relay lens 78K, is arranged downstream of fixed reticle blind 46 on the optical path of the pulse ultraviolet beam inside the second illumination system housing 76B. Further downstream of the second relay lens 78N on the optical path, the mirror 78Q which reflects the pulse ultraviolet light having passed through the second relay lens 78N is arranged. And still further downstream on the optical path the main condenser lens system 78R is arranged.

With the structure described above, the incident surface of the first fly-eye lens system 78C, the incident surface of the second fly-eye lens system 78G, the arrangement surface of the movable blades $BL_1$ and $BL_2$ of the movable reticle blind unit 50, and the pattern surface of the reticle R are arranged optically conjugated with each other. The light source surface formed on the outgoing side of the first fly-eye lens system 78C, the light source surface formed on the outgoing side of the second fly-eye lens system 78G, and the Fourier transform surface of the projection optical system PL (exit pupil surface) are arranged optically conjugated with each other, forming a Koehler illumination system.

Operation of the illumination optical system IOP having the structure described above, that is, the first partial illumination optical system IOP1 and the second partial illumination optical system IOP2 will now be briefly described. When the pulse ultraviolet beam from the light source 62 enters the first partial illuminating optical system IOP1 via the beam matching unit BMU, the variable beam attenuator 78A adjusts the beam to a predetermined peak intensity, and then the beam enters the beam shaping optical system 78B. The pulse ultraviolet beam shape is then adjusted by the beam shaping optical system 78B, so that it can efficiently enter the first fly-eye lens system 78C arranged further downstream on the optical path. When the pulse ultraviolet beam enters the first fly-eye lens system 78C next via the mirror 78F, a planar light source, that is, a secondary light source comprising many light source images (point light sources) is formed on the outgoing side of the first fly-eye lens system 78C. The pulse ultraviolet beam released from each of these multiple point light sources enters the second fly-eye lens system 78G via the condenser lens system 78E and the vibrating mirror 78D which reduces speckles caused by coherence of the light source. As a result, a tertiary light source is formed in which multiple light source images are uniformly distributed within an area of a predetermined shape at the outgoing end of the second fly-eye lens system 78G. The pulse ultraviolet beam emitted from this tertiary light source passes through an aperture stop on the illuminating system aperture stop plate 78H, and then reaches the beam splitter 78J having a large transmittance and a small reflectivity.

The pulse ultraviolet beam serving as an exposure light having been reflected at the beam splitter 78J, passes through the movable blind unit 50 structuring the reticle blind 5 by the first relay lens system 78K. It then, illuminates the opening of the fixed reticle blind 46 with a uniform intensity distribution.

The pulse ultraviolet beam, having passed through the opening of the fixed reticle blind 46, then reaches the mirror 78O where the optical path is deflected vertically downward via the second relay lens 78N. The pulse ultraviolet beam proceeds through the main condenser lens system 78R to illuminate a predetermined illumination area (a slit-shaped or rectangular illumination area extending linearly in the X-axis direction) on the reticle R held on the reticle stage RST, and illuminates the area with a uniform illuminance distribution. The illumination light irradiated on the reticle R is a rectangular shaped slit, and is set so as to narrowly extend in the X-axis direction (non-scanning direction) at the center of the circular projection view of the projection optical system PL shown in FIG. 4. The width of the illumination light in the Y-axis direction (scanning direction) is set substantially uniform.

Furthermore, also housed within the first illumination housing system 76A structuring the first partial illumination optical system IOP1 are: a condenser lens 82; an integrator sensor 84 made of a photoelectric conversion element; a condenser lens 86; and a reflection light monitor 88 made of the photoelectric conversion element (photodetection element) as of the integrator sensor 84, and the like. As for components such as integrator sensor 84, the pulse ultraviolet light having passed through the beam splitter 78J is then incident on the integrator sensor 84 via the condenser lens 82, and is photo-electrically converted. And the photoelectric conversion signal of the integrator sensor 84 is sent to the main controller 101, via a peak hold circuit and an A/D converter (not shown in Figs.). As the integrator sensor 84, for example, a PIN-type photodiode having sensitivity in the vacuum ultraviolet region as well as a quick response time for detecting the emitted pulse beam of the light source 62 can be used. The correlation coefficient between the output of the integrator sensor 84 and the illuminance (exposure amount) of the pulse ultraviolet beam on the surface of the wafer W is obtained in advance, and stored in the memory in the main controller 101.

The condenser lens 86 and the reflection light monitor 88 are arranged on the optical path of the light reflected off the reticle R within the first illumination system housing 76A. The reflected light from the pattern surface of the reticle R proceeds to the main condenser lens system 78R, the mirror 78O, the second relay lens 78N, the opening of the fixed reticle blind 46, the movable blind unit 50, and passes through the first relay lens 78K. It then passes through the beam splitter 78J, and enters the reflection light monitor 88 via the condenser lens 86, and is finally photo-electrically converted. The photoelectric conversion signal of the reflection light monitor 88 is sent to the main controller 101, via a peak hold circuit and an A/D converter (not shown in Figs.). The reflection light monitor 88 is mainly used to measure the transmittance of the reticle R.

As for the supporting structure of the first and second illumination system housings 76A and 76B, it will be referred to, later in the description.

The reticle stage RST is arranged on a reticle base supporting bed 92, which is fixed horizontally over the supporting column 90 structuring the main portion column 64 which will also be described later. The reticle stage RST is in actual, has an arrangement comprising a reticle coarse adjustment stage which is roughly driven by predetermined strokes in the Y-axis direction by a pair of Y linear motors on the reticle base supporting bed 92. It also comprises a reticle fine adjustment stage on the reticle coarse adjustment stage, which holds the reticle R by adsorption, and is finely driven in the x direction, the Y direction and the θz direction (rotational direction around the Z-axis) by a pair of X voice coil motors and a pair of Y voice coil motors. However, for the sake of simplicity in the description, the reticle stage RST is to be driven by a reticle driving unit 94 (not shown in FIG. 4, refer to FIG. 6). The driving unit 94 is to drive the reticle R linearly on the reticle base supporting bed 92 in the Y-axis direction in large strokes, while finely driving the reticle R in the X-axis direction and the θz direction. As the reaction force canceling mechanism of the reticle stage RST, for example, the reaction force mechanism utilizing the law of conservation of momentum which details are disclosed in, Japanese Patent Laid Open No. 08-63231 and the corresponding U.S. application Ser. No. 266,999 (application filed: Jun. 27, 1994), may be employed. The disclosures cited above are fully incorporated herein by reference.

On an area of the reticle stage RST, a movable mirror 98 is arranged. This movable mirror 98 reflects the measurement beams from a reticle laser interferometer 96 serving as a positional detection unit to measure the position and the moving amount of the reticle. The reticle laser interferometer 96 is fixed on the upper end of the supporting column 90, and measures the position in the X, Y, and Oz direction, that is, measures the X, Y position, and the rotational amount (yawing amount) both simultaneously and individually. The positional information (or the velocity information) of the reticle stage RST (in other words the reticle R) measured by the reticle laser interferometer 96 is sent to the main controller 101 (refer to FIG. 6). The main controller 101 basically controls components such as the linear motors or the voice coil motors structuring the reticle driving unit 94 so as to make the positional information (or the velocity information) output of the reticle laser interferometer 96 coincide with the instructed values (target position, target velocity) of the main controller 101.

As the projection optical system, for example, a refraction optical system structured of only refraction optical elements (lens element) made of quartz or fluorite with a reduction magnification of ¼, ⅕, and ⅙ is used. This system is double telecentric on both the object surface (reticle R) side and the image surface (wafer W) side and has a circular projection field. Therefore, when the pulse ultraviolet light is irradiated on the reticle R, the light flux from the portion irradiated by the pulse ultraviolet light of the circuit pattern area on the reticle R is incident on the projection optical system PL. Then a partial inverted image of the circuit pattern is formed in the center of the circular field on the image surface side of the projection optical system PL, being limited in a slit shape or a rectangular shape per each irradiation of the pulse ultraviolet light. With this operation, the partial inverted image of the circuit pattern projected is reduced and transferred onto a resist layer applied on the surface of a shot area among a plurality of shot areas on the wafer W arranged at the imaging surface of the projection optical system PL.

The main portion column 64 is structured of a barrel supporting bed 108, the supporting column 90 arranged on the bed 108, and a suspended column 61 suspended down from the lower surface of the bed 108. The barrel supporting bed 108 is substantially supported horizontally via three struts 104A to 104C (the strut 104C located in the depth of field of the drawing is not shown in Figs.) arranged on the base plate BP and vibration isolation units 106A to 106C (the vibration isolation unit 106C located in the depth of field of FIG. 4 is not shown, refer to FIG. 6) fixed on top of the struts 104A to 104C. The base plate BP is mounted horizontally on the floor FD and serves as a base of the apparatus. In this embodiment, supporting members 91A and 91B which support the second illumination system housing 76B structuring the second partial illumination optical system IOP2, are fixed on the upper surface of the supporting column 90.

The vibration isolating units 106A to 106C are arranged in series on top of the struts 104A to 104C, and are each made up of an air mount which the internal pressure is adjustable and a voice coil motor. These vibration isolation units isolate subtle vibration travelling from the floor surface FD to the bed 108 via the base plate BP and the struts 104A to 104C at a micro-G level.

The bed 108 is made of a casting or the like, and has a circular opening around the center portion in a planar view. In the opening, the projection optical system PL is inserted from above, directions of the optical axis AX being the Z-axis direction. Around the periphery of the barrel portion of the projection optical system PL, a flange FLG is provided, integrally connected with the barrel portion. As the material of the flange FLG, a material having a low thermal expansion, such as Invar (a heat resistant alloy made of nickel 36%, manganese 0.25%, and metal including carbon and other elements) is used. The flange FLG structures a so-called kinematic supporting mount, which supports the projection optical system in respect to the bed 108 at three points via a point, a plane, and a V groove. Employing this kinematic supporting mount simplifies the incorporation of the projection optical system PL to the bed 108, and moreover there are advantages of stress due to the vibration of the bed 108 and the projection optical system PL, temperature change, and posture being most effectively reduced after incorporation.

The wafer stage WST is supported on the wafer base supporting bed 66 which structures the bottom surface of the suspended column 61 with air pads (air bearings) by levitation, via for example, a clearance of around several microns. The wafer stage WST is driven within an XY two-dimensional plane by a wafer driving unit 122 (not shown in FIG. 4, refer to FIG. 6) made up of a magnetic levitation two-dimensional linear actuator, and the like.

On the upper surface of the wafer stage WST, the wafer W is fixed via the wafer holder 138 by electrostatic clamping or vacuum chucking. The XY position of the wafer stage WST is measured real time with a predetermined resolution, for example around 0.5–1 nm, by the laser interferometer 140 which measures the positional change of the movable mirror Ms fixed on an area of the wafer stage WST. The reference mirror Mr fixed on the lower end of the barrel of the projection optical system is used for reference on measurement. In actual, the reference mirror (fixed mirror) and movable mirror are respectively arranged for measuring the position in the X-axis direction and in the Y-axis direction. Likewise, with the corresponding laser interferometers, the laser interferometer 140X is used for measuring the position in the X-axis direction, and the laser interferometer 140Y is used for the Y-axis direction (refer to FIG. 6). However, for the sake of convenience, in FIG. 4, these components are represented as reference mirror Mr, movable mirror Ms, and laser interferometer 140.

Figure 6:
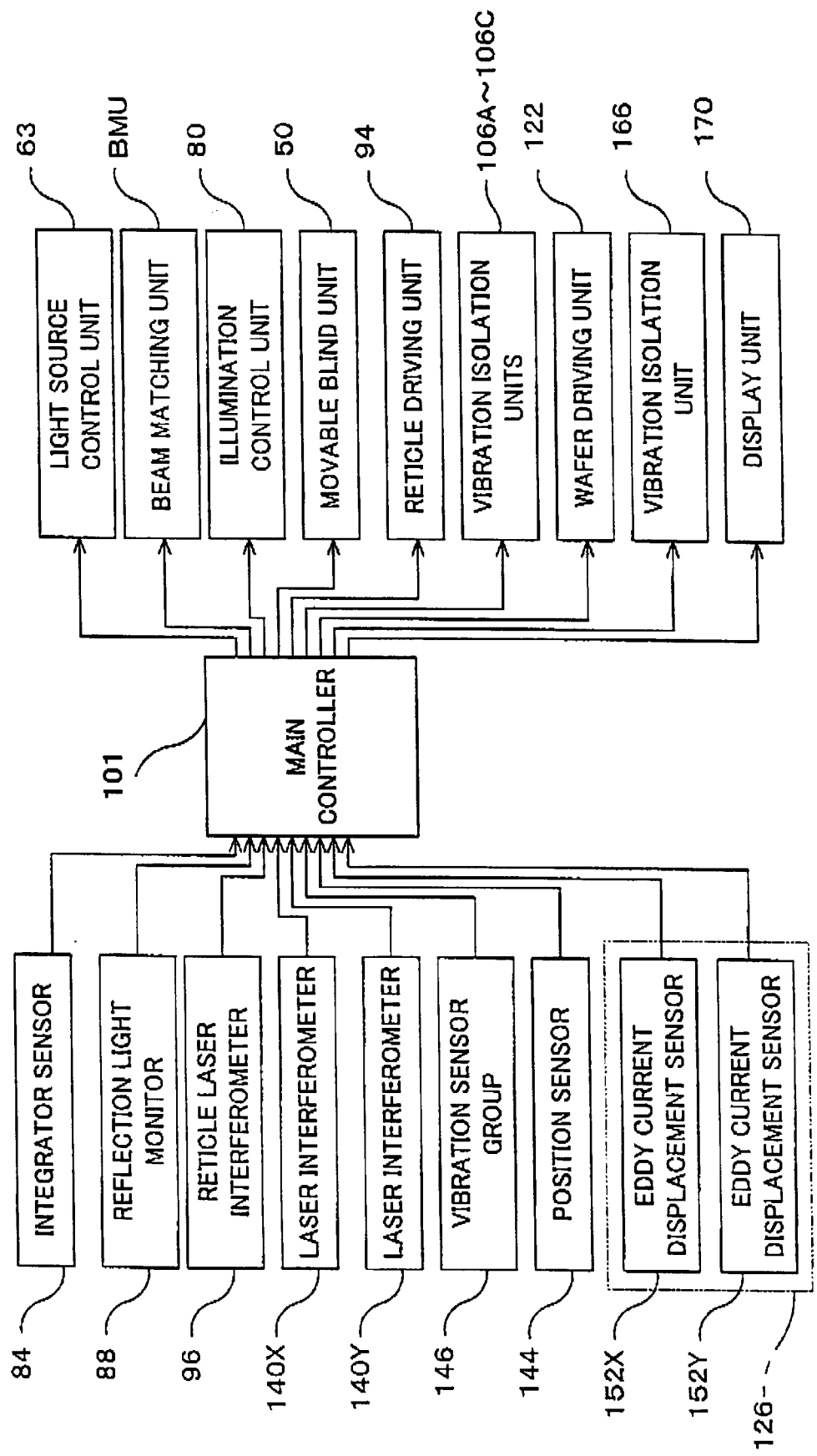
FIG. 6 is a block diagram showing an arrangement of the control system of the apparatus shown in FIG. 4.

The measurement values of the laser interferometer 140X and 140Y are sent to the main controller 101 (refer to FIG. 6). At least one of the laser interferometer 140X and 140Y is a multi-axis interferometer having more than one axis. Accordingly, the main controller 101 can obtain not only the XY position of the wafer stage WST, but also the θz rotation amount (yawing amount), or in addition the θx rotation amount (the rotation amount around the X-axis, referred to as the pitching amount in this embodiment) and the θy rotation amount (the rotation amount around the Y-axis, referred to as the rolling amount in this embodiment) based on the measurement values of the laser interferometer 140X and 140Y.

On the bed 108, although it is omitted in FIG. 4, in actual, three vibration sensors (for example, accelerometers) are arranged to measure the vibration of the main column 64 in the Z direction. Another three vibration sensors (for example, accelerometers) (for example, of the three vibration sensors two measure the vibration of the main column 64 in the Y direction, and the remaining measures the vibration in the X direction) are also arranged on the bed 108 to measure the vibration in the XY plane direction. In the following description, these six vibration sensors will be collectively referred to as the vibration sensor group 146. The measurement values of the vibration sensor group 146 are sent to the main controller 101 (refer to FIG. 6). Accordingly, the main controller 101 can obtain the vibration of the main column 64 based on the measurement values of the vibration sensor group 146 in directions of six degrees of freedom.

The main controller 101, therefore, controls the velocity of the vibration isolation unit 106A to 106C by, for example, feedback control or feedback control and feedforward control. By this control, the vibration of the main column 64 in directions of six degrees of freedom obtained based on the measurement values or the vibration sensor group 146 measured when the reticle stage RST or the wafer stage WST is moving, or are synchronously moved, is to be eliminated. Consequently, this allows the main controller to effectively suppress the vibration of the main column 64.

Also, in between the base plate BP and the bed 108, a position sensor 144 (not shown in FIG. 4, refer to FIG. 6) is arranged to measure the relative displacement between the base plate BP and the bed 108 in directions of six degrees of freedom. The measurement values of the position sensor 144 are also sent to the main controller 101. Accordingly, the main controller 101 can obtain the positional relationship between base plate BP and the main column 64 in directions of six degrees of freedom based on the measurement values of the position sensor 144. And by using this information on the positional relationship, the main controller 101 controls the vibration isolation unit 106A to 106C, so as to keep the main column 64 at a stable position regularly with the base plate BP as a reference.

A supporting column 168 supports the first illumination system housing 76A of the first partial illumination optical system IOP1. The supporting column 168 serves as a second column on the base plate BP via the vibration isolation unit 166 supported at three points. For the vibration isolation unit 166, similar with the vibration isolating units 106A to 106C, an active vibration isolation unit is used comprising an air mount and a voice coil motor (an actuator), and a vibration detection sensor (for example, an accelerometer) attached to the supporting column 168. Likewise, the vibration isolation unit 166 isolates vibration travelling from the floor surface FD at a micro-G level.

As described earlier, the movable blind unit 50 and fixed reticle blind 46 that make up the reticle blind 5 are arranged respectively in the first illumination system housing 76A and the second illumination system housing 76B. Different columns, that is, the supporting column 168 and the main column 64, support these components, and the reason for such an arrangement will be described next.

The fixed reticle blind 46 determines the illumination area on the surface of the reticle (the pattern surface of the reticle). Therefore, if the fixed reticle blind is separated from the side of the main column 64, as a consequence, the exposure area (an area on the image plane conjugate with the illumination area) on the wafer w changes, and the image plane illuminance loses stability during exposure. Thus, it is arranged within the second illumination system housing 76B, which is supported by the main column 64 via the supporting members 91A and 91B.

As for the movable blind unit 50, in this embodiment, the movable blades $BL_1$ and $BL_2$ structuring the movable blind unit 50 are driven by the linear motors 43A and 43B (refer to FIG. 2) in the direction corresponding to the scanning direction. Accordingly, it is difficult for the movable blades to be the cause of vibration of the main column 64 during scanning exposure compared to the case using the conventional rotary motors. In actual, however, the friction caused during constant movement is not completely zero, and the reticle stage RST in particular is driven in the scanning direction with high acceleration. And when the movable blades $BL_1$ and $BL_2$ are driven in the direction corresponding to the scanning direction (Z-axis direction) in synchronous with the reticle stage RST, reaction force occurs. Therefore, in order to surely prevent the reaction force from being the cause of vibration of the main column 64 and the like, the movable blind 50 is arranged within the first illumination system housing 76A, which is supported by the supporting column 168. With this arrangement, the movable blind 50 is separated from the main column 64 in respect to vibration (physically separated). Also, as described earlier, the movable blades $BL_1$ and $BL_2$ need only to prevent the irradiation of illumination light for exposure on the area outside the shield strip arranged in the periphery of the pattern area on the reticle R. The width of the shield strip is normally 1.5–3 mm, or even wider. The accuracy required, therefore, is substantially moderate, even when considering the vibration of the main column 64 caused by driving the reticle stager RST, the wafer stage WST, and the like, the vibration of the supporting column 168 caused by driving the movable blades $BL_1$ and $BL_2$, the defocus of the movable blades $BL_1$ and $BL_2$, and the distortion of the illumination optical system IOP. Accordingly, when scanning exposure is performed as is described in the first embodiment with the movable blades $BL_1$ and $BL_2$ controlled in synchronous with the reticle stager RST (refer to FIG. 3), the area outside the shield strip in the periphery of the pattern area on the reticle R can be kept from being irradiated by the illumination light.

Furthermore, in this embodiment, a position measurement unit 126 is arranged in the vicinity of the position where the movable blind unit 50 is arranged, which is optically almost conjugate with the pattern surface of the reticle. The position measurement unit 126 measures the relative displacement between the first illumination system housing 76A (that is, the supporting column 168) of the first partial illumination optical system IOP1 and the second illumination system housing 76B (that is, the main column 64) of the second partial illumination optical system IOP2.

Figure 5:
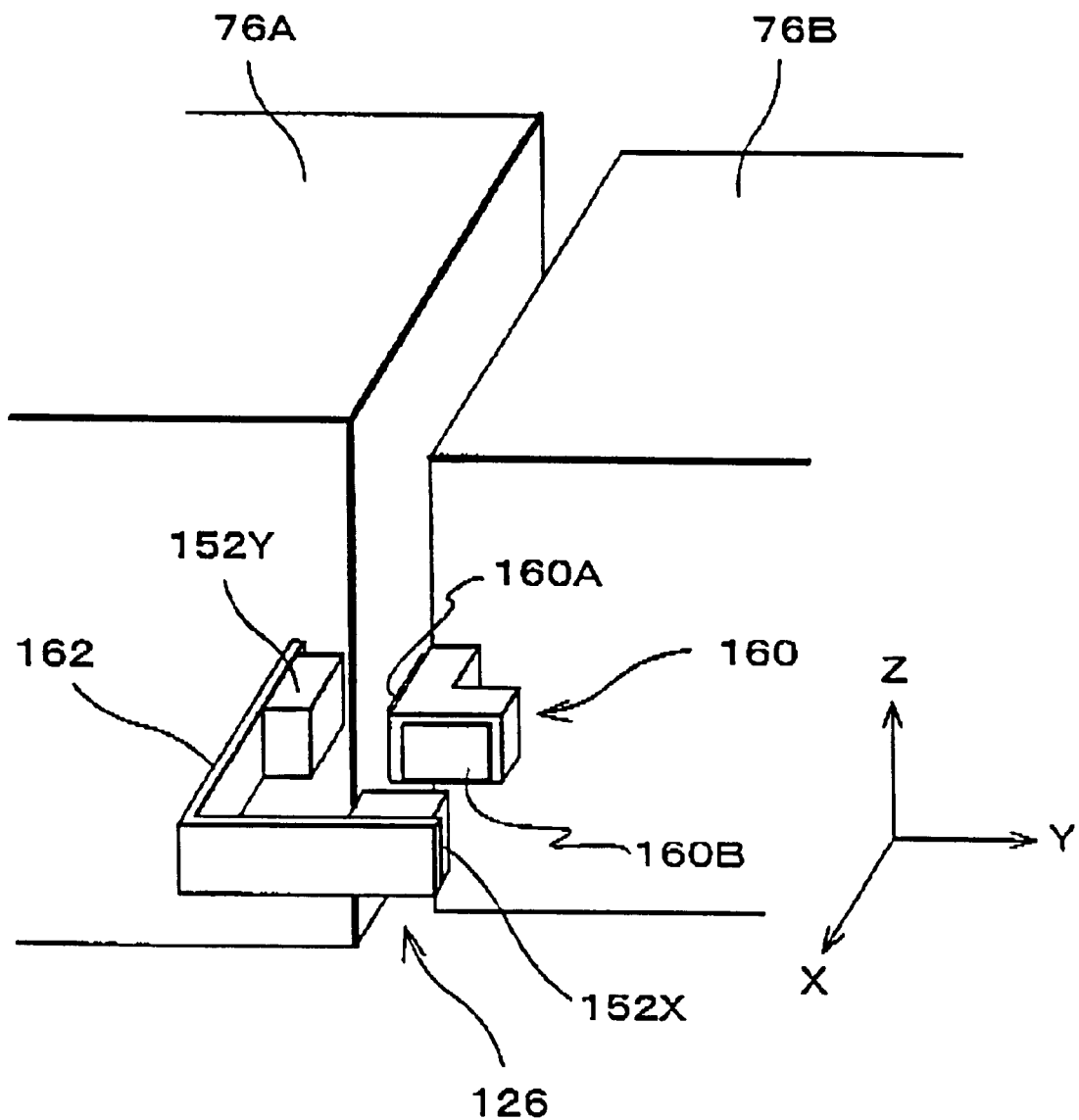
FIG. 5 is a schematic perspective view of the position measurement unit arranged in the vicinity on the margin of the first and second illumination system housing 76A and 76B of the apparatus shown in FIG. 4.

More particularly, as is shown in FIG. 5, the position measurement unit 126 comprises a metal plate 160A fixed on a surface on the –Y side (the surface is almost parallel to XZ plane) of an L-shaped member 160. The L-shaped member 160 projects outward on a +X side surface at the edge in the –Y direction of the second illumination system housing 76B. It also comprises a metal plate 160B fixed on a surface on the +X side (the surface is almost parallel to YZ plane), and respectively facing these metal plates 160A and 160B, two eddy current displacement sensors 152Y and 152X are attached to an L-shaped member 162. The L-shaped member 162 projects outward on a +X side surface at the edge in the +Y direction of the first illumination system housing 76A.

For the eddy current displacement sensors 152Y and 152X, sensors which have a response frequency, in other words, a natural frequency which indicate the degree for responsiveness around 500 Hz, and also have a resolution of 1 $\mu$m are used. Following is the detection principle of the eddy current displacement sensor. In the case an alternating voltage is applied to a coil wrapped around an insulator and is brought close to a measurement object (in this case, the metal plates) made of a conductor, an eddy current is generated in the conductor by the alternating magnetic field formed by the coil. The direction of the magnetic field formed by this eddy current, is opposite to the magnetic field made by the current of the coil, and these two magnetic fields overlap and affect the output of the coil, changing the amount and phase of the current. This change becomes greater when the measurement object is closer to the coil, and is smaller when further apart, therefore, by extracting the electric signals from the coil, the position and displacement of the measurement object can be obtained. Accordingly, by using the eddy current displacement sensors 152Y and 152X, even if both sensors are in a static state, the position and displacement of the measurement object can be measured. That is, the absolute distance can be measured. Therefore, not only when the main column 64 is vibrating as in scanning exposure, the position and displacement of the metal plate 160A and 160B can be measured when the reticle stage RST, wafer stage WST, and the movable blades $BL_1$ and $BL_2$ are all in a static state. Consequently, it becomes possible to measure the displacement of the metal plate 160A and 160B due to the tilt and distortion of the floor FD occurring with the elapse of time.

Instead of using the eddy current displacement sensor, other types of sensors can be used to make up the position measurement unit, such as a capacitance non-contact displacement sensor that can measure absolute distance similarly as described above, or a photocoupler. Alternatively, it is possible to arrange a relative distance measuring sensor such as an interferometer. In such a case, however, the relative displacement can only be measured when either of the first illumination system housing 76A or the second illumination system housing 76B is moving due to vibration, and the like.

As is described, in this embodiment, the eddy current displacement sensor 152Y measures the relative displacement in the Y-axis direction around the surface conjugate with the pattern surface of the reticle R between the illumination system housing 76A and 76B at the resolution previously mentioned. Also, the eddy current displacement sensor 152X measures the relative displacement in the X-axis direction around the surface conjugate with the pattern surface of the reticle R between the illumination system housing 76A and 76B. The measurement values of the eddy current displacement sensors 152X and 152Y are sent to the main controller 101 (refer to FIG. 6).

FIG. 6 briefly shows the control system of the exposure apparatus 200 described above. In this control system, the main controller 101, being a workstation (or a microcomputer), plays the central role. On the input side of the main controller 101, the integrator sensor 84, the reflection light monitor 88, the reticle laser interferometer 96, laser interferometer 140X and 140Y, the vibration sensor group 146, position sensor 144, and the eddy current displacement sensors 152X and 152Y are connected. In addition, on the output side, the light source control unit 63, the beam matching unit BMU, the illumination control unit 80, the movable blind unit 50, the reticle driving unit 94, the vibration isolation units 106A to 106C, the wafer driving unit 122, vibration isolation unit 166, and a display device 170 are connected. The main controller 101, other than the various controls described so far, performs overall control over the apparatus. Furthermore, the main controller 101 controls the movable blind unit in accordance with the vibration of the main column 64 on scanning exposure, detects and corrects the relative displacement between the main column 64 and the supporting column 168 occurring with the elapse of time. It also displays warnings, which will be referred to later in the description.

Exposure operation of the exposure apparatus 200 having the arrangement as above, will be described next.

As a premise, various exposure conditions are set to perform scanning exposure on the shot areas on the wafer W with an appropriate exposure amount (target exposure amount). And, likewise with the first embodiment, preparatory operations such as reticle alignment and baseline measurement using the reticle microscope and the off-axis alignment sensor (both not shown in Figs.) are performed. After completing these operations, fine alignment (such as EGA (enhanced global alignment)) of the wafer W using the alignment sensors is performed. Then, the arrangement coordinates of the plurality of shot areas on the wafer W are obtained.

When the series of preparatory operations to expose the wafer W have been completed, the main controller 101 controls the wafer driving unit 122 and moves the wafer stage WST to the scanning starting position of the first shot area on the wafer W. During this control, the measurement values of the laser interferometer 140X and 140Y are monitored, in accordance with the alignment results.

Then, the main controller 101 starts the scanning of the reticle stage RST and the wafer stage WST in the Y direction via the driving unit 94 and 122. When both the reticle stage RST and the wafer stage WST reach the respective target scanning velocity, and a predetermined settling time elapses, the pattern area of the reticle R is irradiated with the pulse laser light, thus scanning exposure begins.

Prior to this scanning exposure, the light source.62 starts to irradiate the exposure light. The motion of the movable blade $BL_1$ (or $BL_2$) of the movable blind unit 50 structuring the reticle blind 5, however, is synchronously controlled with the reticle stage RST. Therefore, the area outside the shield strip in the periphery of the pattern area on the reticle R can be kept from being irradiated by the pulse ultraviolet light, likewise with the first embodiment.

The main controller 101 controls the reticle stage RST and the wafer stage WST in synchronous via the reticle driving unit 94 and the wafer driving unit 122 so that especially during the scanning exposure described above, the moving velocity $V_R$ of the reticle stage RST in the Y-axis direction and the moving velocity $V_W$ of the wafer stage WST in the Y-axis direction are kept at the velocity ratio corresponding to the projection magnification of the projection optical system PL.

Then, the pulse ultraviolet light sequentially illuminates a different area of the pattern area of the reticle R, and when the entire pattern area has been illuminated, scanning exposure of the first shot area on the wafer W is completed. And by these operations, the pattern on the reticle R is reduced and transferred onto the first shot area via the projection optical system PL. Also in this case, similar to the first embodiment, by the movable blade $BL_1$ (or $BL_2$) the area outside the shield strip in the periphery of the pattern area on the reticle R can be kept from being irradiated by the pulse ultraviolet light even after completing the exposure.

When scanning exposure of the first shot area is completed in the manner described above, the main controller 101 steps the wafer stage WST in the X-axis and Y-axis direction via the wafer driving unit 122, and positions it at the scanning starting position of the second shot area. When performing this stepping operation, the main controller 101 measures the positional displacement of the wafer stage WST in the X, Y, and θz directions real time, in accordance with the measurement values of the laser interferometer 140X and 140Y that detects the position of the wafer stage WST (position of the wafer W). And based on the measurement results, the main controller 101 controls the position of the wafer stage WST so that the XY positional displacement of the wafer stage WST is at a predetermined state by controlling the wafer driving unit 122.

In addition, the main controller 101 controls the reticle driving unit 94 based on the information on the displacement of the wafer stage WST in the θz direction, and rotationally controls the reticle stage RST (reticle fine adjustment stage) to compensate for the rotational displacement error occurring on the wafer W side.

Then, the main controller 101 performs scanning exposure similarly as above on the second shot area.

In this manner, scanning exposure and stepping operations to expose the following shot area is repeatedly performed, and the pattern formed on the reticle R is transferred step by step onto the entire shot area on the wafer W subject to exposure.

With the scanning exposure apparatus 200 in this embodiment, the main controller 101 controls the vibration isolation units 106A to 106C in accordance with the output of the vibration sensor group 146 and the position sensor 144. By doing so, the vibration or tilt and the like of the main column 64 generated by the reaction force or the offset load, which are in turn, generated when driving the wafer stage on wafer alignment, stepping operations, and the like, can be suppressed or corrected. In addition, the positional adjustment of the main column 64 in the Z direction can be adjusted by the main controller 101 by adjusting the internal pressure of the air mounts structuring the vibration isolation units 106A to 106C, in accordance with the output of the position sensor 144.

Meanwhile, in the case a damped harmonical deformation occurs to the main column 64 due to the reaction force generated when the reticle stage RST and wafer stage WST are respectively driven, as in for example the acceleration or deceleration on scanning exposure, even if the vibration isolation units 106A to 106C tries to control the vibration to maintain the position and posture of the main column 64 at the initial state, it would be difficult to suppress the initial displacement of the main column 64, as is described earlier. This is because the main column 64 has an extremely high mass, incorporating components such as the reticle stage RST, projection optical system PL, and wafer stage WST, and moreover, the responsiveness of the driving portion (actuator) of the vibration isolation units 106A to 106C is not sufficiently high.

However, in such a case, in this embodiment, the main controller 101 detects the initial displacement of the main column 64 in the XY two-dimensional direction or the relative displacement between the main column 64 and the first illumination system housing 76A at a position almost conjugate with the pattern surface of the reticle. The detection is performed in accordance with the measurement values of the eddy current displacement sensors 152Y and 152X. Of the position measurement unit 126. Of the displacements, the displacement in the Y direction can be controlled with the motion of the movable blades $BL_1$ and $BL_2$ structuring the movable blind unit 50 being controlled in the direction corresponding to the scanning direction (Z direction) via the linear motors 43A and 43B. The driving portion of the movable blind unit 50 has smaller mass compared with main column 64, therefore, can secure high responsiveness. And of displacement in the X direction, it can be controlled with the motion of the movable blades $BL_1$ and $BL_2$ being controlled in the direction corresponding to the non-scanning direction via the ultrasonic motors (not shown in Figs.). Thus, the positional error occurring between the shielding strip of the reticle R and the movable blades $BL_1$ and $BL_2$ can be avoided, and the movable blades $BL_1$ and $BL_2$ can sufficiently follow-up the reticle R (reticle stage RST) without affecting the shielding properties.

Also, the main controller 101 measures the relative displacement between the supporting column 168 and the main column 64 occurring with the elapse of time, in a static state where the reticle stage RST, wafer stage WST and the movable blades $BL_1$ and $BL_2$ are still. This measurement is based on the measurement values of the eddy current displacement sensors 152Y and 152X of the position measurement unit 126. The main controller 101 then decides whether the relative displacement is within a predetermined permissible value. And if it is, then the zero offset of the movable blind unit 50 is updated to a zero offset corresponding to the relative displacement measured as described above. By this operation, even if the floor FD where the main column 64 and the supporting column 168 are set is distorted over the elapse of time and a static relative displacement occurs between the main column 64 and the supporting column 168 with the elapse of time, consequently resulting in a displacement of the optical axis between the first partial illumination optical system and the second partial illumination optical system, a synchronous error (the positional error) occurring between the reticle R (the reticle stage RST) and the movable blades $BL_1$ and $BL_2$ can be prevented without affecting the shielding properties.

The predetermined permissible value, referred to above, can be determined in the following manner. That is, with a scanning stepper in general, in the periphery of the illumination area determined by the fixed reticle blind 46 on the reticle R, within the area shielded with the fixed reticle blind 46 and the movable blades $BL_1$ and $BL_2$, an area having uniform illuminance with the illumination area is set with a margin to some extent by the illumination optical system. Accordingly, when the zero offset of the movable blades $BL_1$ and $BL_2$ is small and the actual illumination area fits within the margin above, by updating the offset the uniform illuminance can be maintained. On the other hand, when the zero offset of the movable blades $BL_1$ and $BL_2$ is large and the actual illumination area exceeds the margin, the illuminance uniformity cannot be kept. Therefore, the threshold value to maintain this illuminance uniformity is determined as the "permissible value" of the zero offset described above.

Accordingly, when the illuminance uniformity cannot be maintained by updating the zero offset the main controller 101 raises an alarm while displaying a warning notice on the displaying unit corresponding to the abnormal state. The operator can then acknowledge that a relative displacement which exceed the limit has occurred between the main column 64 and the supporting column 168, therefore, can take necessary actions, and exposure failure can be prevented beforehand.

As is obvious from the description so far, in the second embodiment, the main controller 101 performs the role of: an adjustment unit to control the driving unit so as to make the movable blade $BL_1$ and $BL_2$ move in synchronous with the reticle stage RST; a decision-making unit to decide whether the static relative displacement occurring between the main column 64 and the supporting column 168 is within the permissible value based on the measurement values of the position measurement unit 126; and a correction unit to correct the positional error due to the relative displacement by providing the zero offset corresponding to the relative displacement to the adjustment unit or the position control system of the main column when the decision made above is affirmative. Also, in the case the decision made above is negative, a warning unit which raises a warning is realized, with the functions of the display unit 170 and the main controller 101.

According to the detailed description, with the scanning exposure apparatus 200 related to this embodiment, a major cause of vibration of the main column 64 during scanning exposure can be removed without interfering with the exposure amount control and the shielding properties. Consequently, the exposure precision can be improved. In the future, when stage performance with a much higher acceleration becomes a requirement for a scanning exposure apparatus, a scanning exposure apparatus of a similar type as this embodiment is expected to show excellent results. Also, with the scanning exposure apparatus related to this embodiment, even if a tilt or distortion occurs on the floor surface FD, the apparatus can maintain its exposure amount control and its shielding properties.

In the second embodiment above, the case where the positional relationship in the X direction and Y direction between the first illumination system housing 76A (supporting column 168) and the second illumination system housing 76B (main column 64) is measured by the position measurement unit 126 is described. However, the present invention is not limited to this. Alternatively, a plurality of sets of position measurement units similar to the position measurement unit 126 can be prepared. And by arranging these units so that the relative displacement between the supporting column 168 and main column 64 can be measured at: at least two points in the X direction; at least one point the Y direction; and at least three points in the Z direction, consequently, the relative displacement between the supporting column 168 and main column 64 can be measured in directions of six degrees of freedom. In this case, a driving portion may be arranged as well, to rotate the entire movable blind unit 50 around the Y-axis or to tilt the unit in respect to the XZ surface. In addition, the vibration isolation units 106A to 106C can be used to drive the main column 64 in the Z direction.

Furthermore, in the second embodiment described earlier, the movement of the movable blades $BL_1$ and $BL_2$ were controlled so as to cancel out the positional error between the reticle R (the fixed blind) and movable blind. Alternatively, to cancel out the positional error, the whole movable blind unit 50 may be made capable of moving in directions corresponding to the scanning direction and the non-scanning direction (the Z and X directions in FIG. 4). The whole movable blind unit 50, may of course, be made so that it can perform at least one of a rotation within the XZ plane, a two-dimensional tilt in respect to the XZ plane, or a translation in the Y direction. In addition, the vibration isolation unit 166 may move the movable blade blind unit 50 in the Z direction.

Also, in the second embodiment described above, not only the driving portion which drives the movable blades $BL_1$ and $BL_2$ in the direction corresponding to the scanning direction of the reticle R, but also the driving portion for the direction corresponding to the non-scanning direction is arranged on the side of the supporting column 168, separate from the main column 64. However, the present invention is not limited to this, and an arrangement can be made where only the driving portion (including the movable blades) corresponding to the scanning direction, which becomes the major cause of vibration, is arranged on the side of the supporting column 168. In this case, the number of the movable blades required, is four.

Also, it is preferable for the pair of movable blades that determine the width of the illumination area in the non-scanning direction to be arranged on a surface almost conjugate with the pattern surface of the reticle R, inside the second partial illumination optical system IOP2. However, they may be arranged close to the fixed blind 46. This is because they cannot be the cause of reducing the synchronous movement accuracy between the reticle R and the wafer W since they are not driven during scanning exposure, therefore, they can be arranged inside the second partial illumination optical system IOP2. Also, by separating them from the movable blades for the scanning direction, the positioning accuracy can be relaxed. In addition, when the width of the illumination area on the reticle R in the non-scanning direction does not have to be changed in accordance with the size of the pattern to be transferred on the wafer W, the width of the illumination area in the non-scanning direction can be determined by the fixed blind. Consequently, in this case, the pair of movable blades for the non-scanning direction does not necessarily have to be arranged.

Furthermore, in the second embodiment described above, the movable blind unit used is identical to the one used in the first embodiment. Therefore, the driving portion for driving the movable blades $BL_1$ and $BL_2$ in the direction corresponding to the scanning direction are structured of linear motors 43A and 43B, and as for the direction corresponding to the non-scanning direction ultrasonic motors are used. Thus, the position controllability of the movable blades themselves of the scanning direction improve compared with being driven by conventional rotary motors. This is because linear motors generate less vibration than as that of rotary motors, and are capable of high acceleration, and excel in controllability. However, the present invention is not limited to this, and the driving portions corresponding to both directions can be structured of only linear motors or ultrasonic motors, or either one of the driving portions may be structured with linear motors.

Also, with the second embodiment described above, the fixed blind is arranged in the IOP, more particularly, within the second partial illumination optical system IOP2, however it may be arranged in the vicinity of the reticle R. In the case of arranging the fixed blind on the opposite side of the pattern surface of the reticle R, for example, it may be attached to one end of the second illumination system housing 76B, and when it is arranged on the pattern surface side, it may be integrally attached to the projection optical system PL. Furthermore, when using an optical system that forms a primary image (intermediate image) of the pattern of the reticle R, and re-forms the intermediate image on the wafer, the fixed blind can be arranged on the surface where the intermediate image is formed or in the vicinity of the area. That is, so long as the illumination area of the illumination light for exposure is determined on the wafer, the fixed blind may be positioned anywhere. A structure, which arranges the fixed blind separately from the main column 64, may be considered. However, since it is difficult to control the relative movement between the fixed blind and the main column (for example, the optical axis of the illumination optical system IOP (projection optical system PL)) so that the positional error is always zero, it is preferable to arrange the fixed blind to the main column.

Furthermore, with the second embodiment described above, the interior of the first and second illumination system housing 76A and 76B that structure the first partial illumination optical system IOP1 and the second partial illumination optical system IOP2 are respectively sealed from outside air. And the interior is filled with air (oxygen) which concentration does not exceed a few percent, and is preferably filled with clean dry nitrogen gas ($N_2$) or a helium gas (He) having an air (oxygen) concentration less than 1%. However, the present invention is not limited to this. Therefore, one or more optical elements arranged respectively inside the first and second illumination system housing 76A and 76B may further be covered with a different case, and the interior of the case may be filled with clean dry nitrogen gas ($N_2$) or a helium gas (He). That is, gases may be purged in the interior of the illumination optical system having a double structure. In this sense, the first and second illumination system housing 76A and 76B may both be covered with a third housing, and the third housing may have the interior filled with clean dry nitrogen gas ($N_2$) or a helium gas (He). In this case, however, the third housing needs to be devised such as to partially use bellows so as to allow the relative displacement described previously between the first and second illumination system housing 76A and 76B.

Also, with the second embodiment described above, the wafer stage WST is mounted on the wafer base supporting bed suspended from the barrel supporting bed 108. The present invention, however, is not limited to this, and can be suitably applied to a scanning exposure apparatus where the wafer base supporting bed is arranged separately form the main column supporting the reticle stage (and the projection optical system PL). In this case, however, the positional relationship between the main column and the wafer base supporting bed needs to be grasped at all times. So, for example, other than the position sensor to measure the positional relationship between the base plate where the main column is mounted and the main column, a position sensor needs to be arranged to measure the positional relationship between the base plate and the wafer base supporting bed.

In addition, in the second embodiment described above, the fly-eye lens is used as the optical integrator (homogenizer). Alternatively, a rod integrator may be used. With an illumination optical system using the rod integrator, the rod integrator is arranged so that the outgoing surface is substantially conjugate with the pattern surface of the reticle R. So, the movable blind unit 50 (at least the scanning blade 49 and 51), is arranged in the vicinity of the outgoing surface of the rod integrator. Accordingly, this illumination optical system is divided into two by the rod integrator, and likewise with the second embodiment, the movable blind unit 50 is arranged in the first partial illumination optical system where the rod integrator is provided, and the fixed blind is arranged in the second partial illumination optical system fixed to the main column. The illumination optical system using the rod integrator is disclosed in detail, for example, in U.S. Pat. No. 5,675,401. The disclosure cited above is fully incorporated herein by reference. Furthermore, the fly-eye lens and rod integrator may be combined, or two units of rod integrators may be connected in series so as to structure a double optical integrator. As can be seen, the structure of the illumination optical system suitable for the scanning exposure apparatus of the present invention, is not limited to the illustration in FIG. 4, and may have any kind of structure.

Also, with the second embodiment described above, the main controller is made to control various units shown on the right half of FIG. 5, however, the present invention is not limited to this, and separate controllers may be arranged respectively to control each of these units. Or, several units may be combined into groups, and a multiple of controllers may control these groups.

And, with the second embodiment described above, the case is described where the vibration isolation unit and the vibration isolation units are all an active vibration isolation unit, however, naturally, the present invention is not limited to this. In other words, all of these units, or either of these units, or a selected plurality of units may be a passive vibration isolation unit.

The exposure apparatus of the present invention is made by assembling various subsystems including elements defined in the claims of the present application so as to keep a predetermined mechanical precision, electrical precision and optical precision. In order to ensure these areas of precision, various optical systems, various mechanical systems, and various electrical systems are adjusted to attain a predetermined optical precision, mechanical precision, and electrical precision, respectively, prior to and after the assembly. The process of incorporating various subsystems into an exposure apparatus includes mechanical connection of various subsystems, by wiring electrical circuits, piping pressure circuits, and the like. Obviously, before the process of incorporating various subsystems into an exposure apparatus, the process of assembling the respective subsystem is performed. After the process of assembling various subsystems into the exposure apparatus, total adjustment is performed to ensure preciseness in the overall exposure apparatus. The exposure apparatus is preferably made in a clean room in which temperature, degree of cleanliness, and the like are controlled.

In each embodiment described above, as the illumination light for exposure, for example, an emission line (g line or i line) in the ultraviolet range which is emitted by an ultra-high pressure mercury lamp, or an excimer laser light (a KrF excimer laser beam or an ArF excimer laser beam), an $F_2$ laser beam, an $Ar_2$ laser beam, or a metal vapor laser beam or a harmonic of a YAG laser beam, and the like, is be used. However, the present invention is not limited to this, and an illumination light having a wavelength of 5–50 nm may be used. For example, the present invention may be suitably applied to a scanning exposure apparatus using EUV light having a wavelength of 13.4 nm or 11.5 nm as the illumination light for exposure. With the exposure apparatus using such EUV light as the illumination light for exposure, an all reflection type optical system is used as well as a reflective type reticle.

Also, for example, with an exposure apparatus likewise with each embodiment using ultraviolet light as the illumination light, the projection optical system may be a reflection/refraction system (catadioptric system) including reflection optical elements and refraction optical elements. In this case, as a reflection/refraction type projection optical system, a reflection/refraction system having a beam splitter and concave mirror as reflection optical elements, which is disclosed in detail in, for example, Japanese Patent Laid Open No. 08-171054 and the corresponding U.S. Pat. No. 5,668,672, Japanese Patent Laid Open No. 10-20195 and the corresponding U.S. Pat. No. 5,835,275 can be used. Or, a reflection/refraction system having a concave mirror and the like as reflection optical elements without using any beam splitter, which his disclosed in detail in, for example, Japanese Patent Laid open No. 08-334695 and the corresponding U.S. Pat. No. 5,689,377, Japanese Patent Laid Open No. 10-3039 and the corresponding U.S. patent application Ser. No. 873,605 (application date: Jun. 12, 1997). The disclosures cited above are fully incorporated herein by reference.

Alternatively, a reflection/refraction system in which a plurality of refracting optical elements and two mirrors (a concave mirror serving as a main mirror, and a sub-mirror serving as a back-mirror forming a reflection plane on the side opposite to the incident plane of a refracting element or a parallel flat plate) may be used. The two mirrors are arranged on an axis, and an intermediate image of the reticle pattern formed by the plurality of refracting optical elements is re-formed on the wafer by the main mirror and the sub-mirror, as disclosed in Japanese Patent Laid Open No. 10-104513 and the corresponding U.S. Pat. No. 5,488,229. In this reflection/refraction system, the main mirror and the sub-mirror are arranged in succession to the plurality of refracting optical elements, and the illumination light passes through a part of the main mirror and is reflected on the sub-mirror and then the main mirror. It then proceeds further through a part of the sub-mirror and reaches the wafer. The disclosures cited above are fully incorporated herein by reference.

Furthermore, as a reflection/refraction type projection optical system a reduction system can be used which projection magnification is ¼ or ⅕, has a circular image field, and is double telecentric on both the object plane side and image plane side. In the case of a scanning exposure apparatus comprising this reflection/refraction type projection optical system, the irradiation area of the illumination light can be in the field of the projection optical system having the optical axis of the projection optical system roughly as the center, and be determined in a rectangular slit shape extending in the direction almost perpendicular to the scanning direction of the reticle or the wafer. With the scanning exposure apparatus comprising such a reflection/refraction type projection optical system, even, for example, in the case of using an $F_2$ laser beam having a wavelength of 157 nm as the illumination light for exposure, a fine pattern of around a 100 nm L/S pattern can be transferred with high precision onto the wafer.

In addition to using an ArF excimer laser beam or an F2 laser beam as vacuum ultraviolet light, a harmonic may be used. This harmonic, is obtained by amplifying a single-wavelength laser beam in the infrared or visible range being emitted by a DFB semiconductor laser or fiber laser with a fiber amplifier doped with erbium (or both erbium and ytteribium), and converting the wavelength into ultraviolet light using a nonlinear optical crystal.

If, for example, the oscillation wavelength of a single-wavelength laser is set within the range of 1.51 to 1.59 μm, an eighth-harmonics whose generation wavelength falls within the range of 189 to 199 nm or a tenth-harmonics whose generation wavelength falls within the range of 151 to 159 nm is output. If the oscillation wavelength is set in the range of 1.544 to 1.553 μm, in particular, an eighth-harmonics whose generation wavelength falls within the range of 193 to 194 nm, i.e., ultraviolet light having almost the same wavelength as that of an ArF excimer laser beam, can be obtained. If the oscillation wavelength is set within the range of 1.57 to 1.58 μm, a tenth-harmonics whose generation wavelength falls within the range of 157 to 158 nm, i.e., ultraviolet light having almost the same wavelength as that of an $F_2$ laser beam, can be obtained.

If the oscillation wavelength is set within the range of 1.03 to 1.12 μm, a seventh-harmonics whose generation wavelength falls within the range of 147 to 60 nm is output. If the oscillation wavelength is set within the range of 1.099 to 1.106 μm, in particular, a seventh-harmonics whose generation wavelength falls within the range of 157 to 158 μm, i.e., ultraviolet light having almost the same wavelength as that of an $F_2$ laser beam, can be obtained. In this case, as a single-wavelength oscillation laser, for example, an ytteribium-doped fiber laser can be used.

Furthermore, the present invention can be applied to not only an exposure apparatus manufacturing microdevices such as a semiconductor element but also to an exposure apparatus for transferring a circuit pattern onto a glass substrate, silicon wafer, or the like to manufacture a reticle or mask. The reticle and mask are used in an apparatus such as an optical exposure apparatus, an EUV exposure apparatus, an X-ray exposure apparatus, an electron beam exposure apparatus, and the like. With the exposure apparatus using light such as DUV (deep ultraviolet) light or VUV (vacuum ultraviolet) light, a transmission type reticle is used in. general, and as the reticle substrate material such as fused silica, fluorine doped silica glass, fluorite, magnesium fluoride, or crystal may be used. Also, with the X-ray exposure apparatus based on the proximity method or an electron beam exposure apparatus, the transmission type mask (stencil mask, membrane mask) is used, and as the mask substrate material such as silicon wafer is used.

The present invention can be suitably applied, as a matter of course, to an exposure apparatus to transfer a device pattern onto a glass plate used to manufacture a display such as a liquid crystal display, to transfer a device pattern onto a ceramic wafer used to manufacture thin-film magnetic heads, and an exposure apparatus used to manufacture image sensing devices (CCDs and the like).

Device Manufacturing Method

A device manufacturing method using the exposure described above in a lithographic process will next be described in detail.

Figure 7:
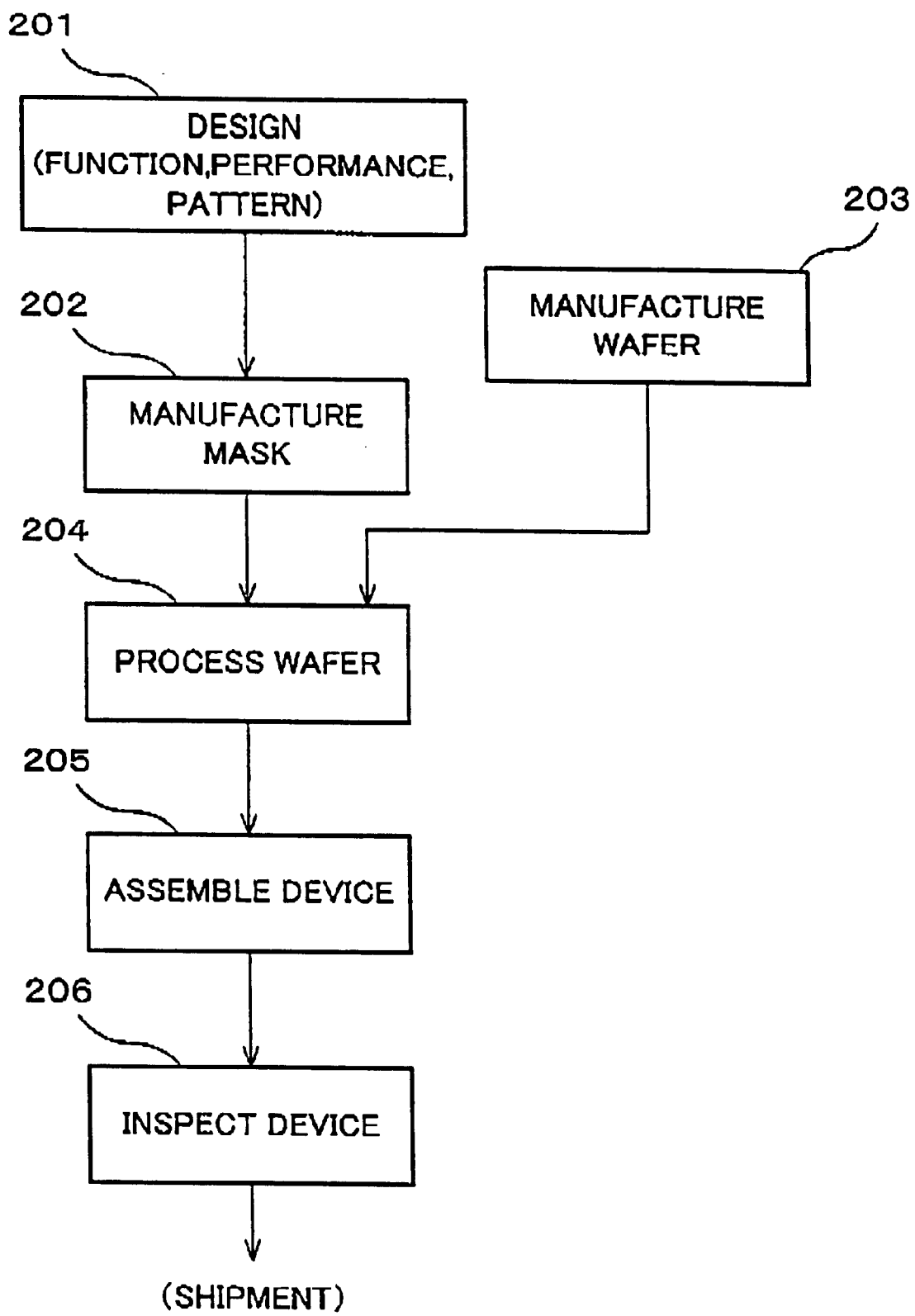
FIG. 7 is a flow chart for explaining an embodiment of a device manufacturing method according to the present invention.

FIG. 7 is a flow chart showing an example of manufacturing a device (a semiconductor chip such as an IC or LSI, a liquid crystal panel, a CCD, a thin magnetic head, a micromachine, or the like). As shown in FIG. 7, in step 201 (design step), function/performance is designed for a device (e.g., circuit design for a semiconductor device) and a pattern to implement the function is designed. In step 202 (mask manufacturing step), a mask on which the designed circuit pattern is formed is manufactured. In step 203 (wafer manufacturing step), a wafer is manufacturing by using a silicon material or the like.

In step 204 (wafer processing step), an actual circuit and the like is formed on the wafer by lithography or the like using the mask and wafer prepared in steps 201 to 203, as will be described later. In step 205 (device assembly step), a device is assembled using the wafer processed in step 204. Step 205 includes processes such as dicing, bonding, and packaging (chip encapsulation).

Finally, in step 206 (inspection step), a test on the operation of the device, durability test, and the like are performed. After these steps, the device is completed and shipped out.

Figure 8:
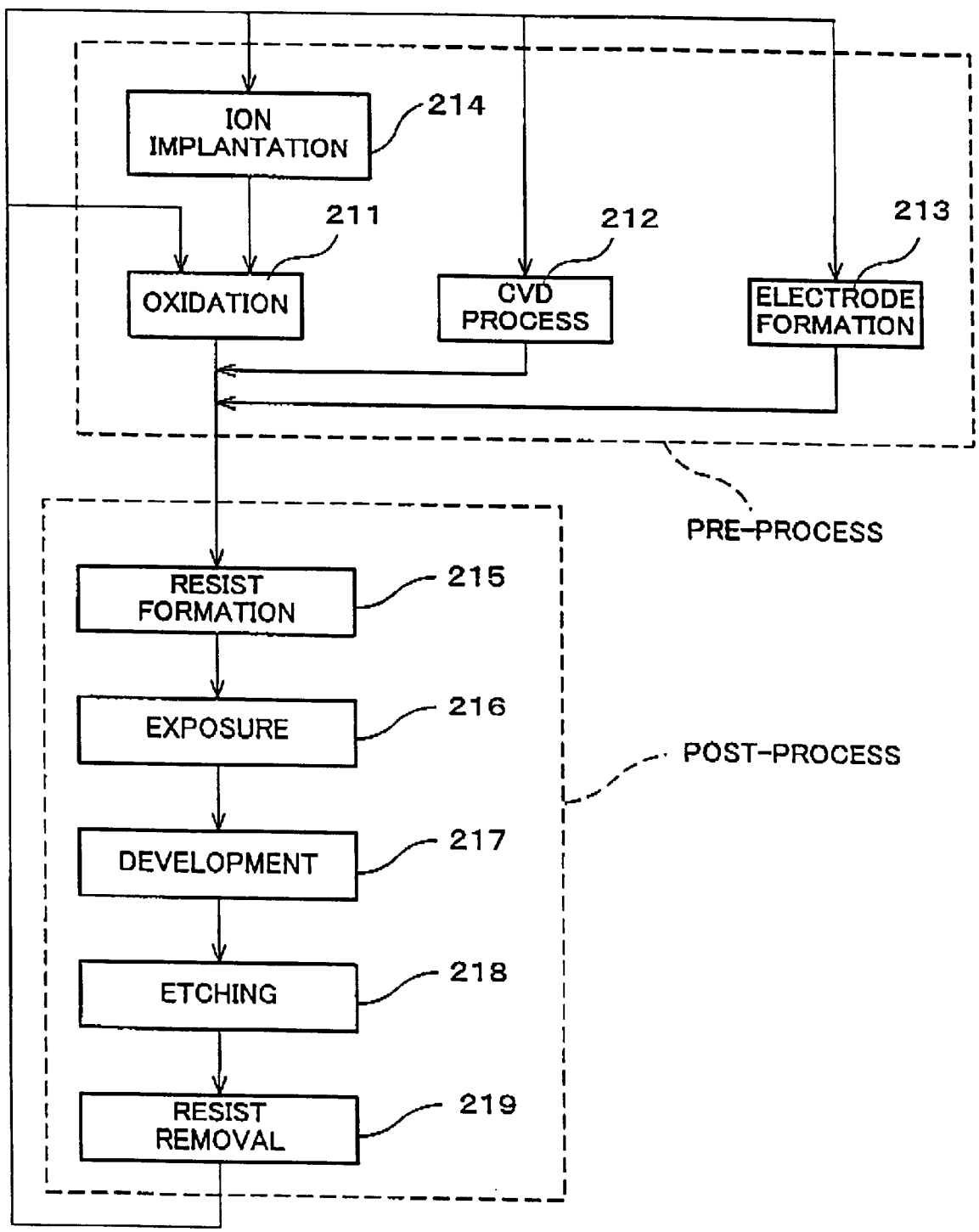
FIG. 8 is a flow chart showing the processing in step 204 in FIG. 7.

FIG. 8 is a flow chart showing a detailed example of step 204 described above in manufacturing the semiconductor device. Referring to FIG. 8, in step 211 (oxidation step), the surface of the wafer is oxidized. In step 212 (CVD step), an insulating film is formed on the wafer surface. In step 213 (electrode formation step), an electrode is formed on the wafer by vapor deposition. In step 214 (ion implantation step), ions are implanted into the wafer. Steps 211 to 214 described above constitute a pre-process for the respective steps in the wafer process and are selectively executed in accordance with the processing required in the respective steps.

When the above pre-process is completed in the respective steps in the wafer process, a post-process is executed as follows. In this post-process, first, in step 215 (resist formation step), the wafer is coated with a photosensitive agent. Next, as in step 216, the circuit pattern on the mask is transcribed onto the wafer by the above exposure apparatus and method. Then, in step 217 (developing step), the exposed wafer is developed. In step 218 (etching step), an exposed member on a portion other than a portion where the resist is left is removed by etching. Finally, in step 219 (resist removing step), the unnecessary resist after the etching is removed.

By repeatedly performing these pre-process and post-process steps, multiple circuit patterns are formed on the wafer.

As described above, according to the device manufacturing method of this embodiment, the exposure apparatus 100 and 200, described in each embodiment are used in the exposure process (step 216). This makes it possible to perform exposure with high precision, which in turn can improve the productivity (including yield) when manufacturing devices having high integration.

While the above-described embodiments of the present invention are the presently preferred embodiments thereof, those skilled in the art of lithography systems will readily recognize that numerous additions, modifications, and substitutions may be made to the above-described embodiments without departing from the spirit and scope thereof. It is intended that all such modifications, additions, and substitutions fall within the scope of the present invention, which is best defined by the claims appended below.

What is claimed is:

1. A scanning exposure apparatus which synchronously moves a mask on which a predetermined pattern is formed and a substrate to transfer the predetermined pattern onto the substrate, the scanning exposure apparatus comprising:

a light source which emits an illumination light to illuminate the mask;

a fixed field stop which sets an illumination area on the mask illuminated by the illumination light;

a movable blind unit which is located further on a side of the light source than the fixed field stop on an optical path of the illumination light, and comprises a movable blade which sets an illumination area on the mask illuminated by the illumination light in accordance with synchronous movement of the mask and the substrate;

a main portion which synchronously moves the mask and the substrate and exposes the substrate with an illumination light via the mask;

a first supporting member which supports the main portion and the fixed field stop; and a second supporting member which is separated from the first supporting member in respect to vibration and supports the movable blind unit.

2. The scanning exposure apparatus according to claim 1, wherein the movable blind unit comprises a linear motor which drives the movable blade.

3. The scanning exposure apparatus according to claim 2, further comprising a mask stage which supports the mask, and moves the mask so that movement of the mask is to be synchronous with movement of the substrate, wherein the linear motor drives the movable blade in accordance with the movement of the mask which is performed by the mask stage and synchronous with the movement of the substrate.

4. The scanning exposure apparatus according to claim 3, wherein:

the fixed field stop is arranged on a surface defocused from a surface conjugate with a pattern surface of the mask; and the movable blade is arranged on a surface conjugate with the pattern surface.

5. The scanning exposure apparatus according to claim 3, further comprising:

a vibration isolator which intervenes between the first supporting member and the second supporting member, the first supporting member and the second supporting member being separated by the vibration isolator in respect to vibration.

6. A device manufacturing method comprising the step of:

transferring a device pattern formed on a mask onto a substrate by using a scanning exposure apparatus according to claim 1.

7. A device manufacturing method comprising the step of:

transferring a device pattern formed on a mask onto a substrate by using a scanning exposure apparatus according to claim 2.

8. A device manufacturing method comprising the step of:

transferring a device pattern formed on a mask onto a substrate by using a scanning exposure apparatus according to claim 5.

\* \* \* \* \*

UNITED STATES PATENT AND TRADEMARK OFFICE
CERTIFICATE OF CORRECTION

PATENT NO. : 6,597,002 B1  Page 1 of 1
DATED : July 22, 2003
INVENTOR(S) : Makoto Kondo It is certified that error appears in the above-identified patent and that said Letters Patent is hereby corrected as shown below:

<u>Title page,</u>
Item [30], Foreign Application Priority Data, should read:

-- Foreign Application Priority Data

Jun. 2, 1998    (JP)    Japan ……………….. 10-169230 --

Signed and Sealed this

Thirtieth Day of December, 2003

JAMES E. ROGAN
*Director of the United States Patent and Trademark Office*